US012618884B2

(12) United States Patent
Xu et al.

(10) Patent No.: US 12,618,884 B2
(45) Date of Patent: May 5, 2026

(54) ULTRAFAST DETECTOR OF RYDBERG ATOMS

(71) Applicants:President and Fellows of Harvard College, Cambridge, MA (US); Massachusetts Institute of Technology, Cambridge, MA (US)

(72) Inventors: Wenchao Xu, Cambridge, MA (US); Vladan Vuletic, Cambridge, MA (US); Sergio Hiram Cantu, Cambridge, MA (US); Valentin Kluesener, Erlangen (DE); Aditya Vignesh Venkatramani, Boston, MA (US); Mikhail D. Lukin, Cambridge, MA (US); Tamara Sumarac, Cambridge, MA (US)

(73) Assignees: President and Fellows of Harvard College, Cambridge, MA (US); Massachusetts Institute of Technology, Cambridge, MA (US)

(*) Notice: Subject to any disclaimer, the term of this patent is extended or adjusted under 35 U.S.C. 154(b) by 76 days.

(21) Appl. No.: 18/233,088

(22) Filed: Aug. 11, 2023

(65) Prior Publication Data

US 2023/0400492 A1    Dec. 14, 2023

Related U.S. Application Data

(63) Continuation of application No. PCT/US2022/016173, filed on Feb. 11, 2022.
(Continued)

(51) Int. Cl.
*G01R 29/08* (2006.01)
*G06N 10/40* (2022.01)

(52) U.S. Cl.
CPC ..... *G01R 29/0885* (2013.01); *G01R 29/0807* (2013.01); *G01R 29/0871* (2013.01); *G06N 10/40* (2022.01)

(58) Field of Classification Search
CPC ........... G01R 29/0885; G01R 29/0807; G01R 29/0871; G06N 10/40; G02F 1/33; G02F 1/35; G02F 2/02; G02F 3/00
See application file for complete search history.

(56) References Cited

U.S. PATENT DOCUMENTS

| | | | |
|---|---|---|---|
| 3,872,470 A | 3/1975 | Hoerz et al. | |
| 4,479,199 A | 10/1984 | Friedlander et al. | |

(Continued)

FOREIGN PATENT DOCUMENTS

| | | |
|---|---|---|
| CN | 104880614 A | 9/2015 |
| CN | 106980178 A | 7/2017 |

(Continued)

OTHER PUBLICATIONS

International Search Report and Written Opinion for International Application No. PCT/US23/26737 dated Sep. 30, 2024.
(Continued)

*Primary Examiner* — Christopher E Mahoney
(74) *Attorney, Agent, or Firm* — Wolf, Greenfield & Sacks, P.C.

(57) ABSTRACT
A device, comprising at least one monochromatic light source configured to generate a first optical trap; an ensemble of particles disposed in the first optical trap, each particle of the ensemble of particles being excitable to a first Rydberg state and a second Rydberg state, the second Rydberg state having a blockade radius, each particle of the ensemble of particles being within the blockade radius of each other and within the blockade radius of an atomic qubit, the atomic qubit being a particle that is excitable to the
(Continued)

second Rydberg state, the ensemble of particles having a first transmissivity at a first wavelength when neither any particle of the ensemble of particles nor the atomic qubit is in the second Rydberg state, the ensemble of particles having a second transmissivity at the first wavelength when the atomic qubit is in the second Rydberg state, the second transmissivity being lower than the first transmissivity; and a second monochromatic light source configured to drive each particle of the ensemble of particles into the first Rydberg state; a probe light source configured to direct a probe beam having the first wavelength to the ensemble of particles; and a photosensor configured to determine the state of the atomic qubit.

28 Claims, 24 Drawing Sheets

Related U.S. Application Data

(60) Provisional application No. 63/148,995, filed on Feb. 12, 2021.

(56) References Cited

U.S. PATENT DOCUMENTS

| | | | |
|---|---|---|---|
| 5,684,621 | A | 11/1997 | Downing |
| 6,988,058 | B1 | 1/2006 | Sherwin et al. |
| 11,380,455 | B2 | 7/2022 | Keesling Contreras et al. |
| 11,710,579 | B2 | 7/2023 | Keesling Contreras et al. |
| 11,985,451 | B2 | 5/2024 | Kim et al. |
| 12,051,520 | B2 | 7/2024 | Keesling Contreras et al. |
| 2002/0089718 | A1 | 7/2002 | Penninckx et al. |
| 2004/0000666 | A1 | 1/2004 | Lidar et al. |
| 2004/0017833 | A1 | 1/2004 | Cundiff et al. |
| 2004/0126114 | A1 | 7/2004 | Liu et al. |
| 2006/0225165 | A1 | 10/2006 | Maassen van den Brink et al. |
| 2007/0113012 | A1 | 5/2007 | Cable et al. |
| 2008/0116449 | A1 | 5/2008 | Macready et al. |
| 2008/0185576 | A1 | 8/2008 | Hollenberg et al. |
| 2008/0237579 | A1 | 10/2008 | Barker et al. |
| 2008/0313430 | A1 | 12/2008 | Bunyk |
| 2009/0204877 | A1 | 8/2009 | Betts |
| 2009/0299947 | A1 | 12/2009 | Amin et al. |
| 2011/0238607 | A1 | 9/2011 | Coury et al. |
| 2014/0025926 | A1 | 1/2014 | Yao et al. |
| 2014/0200689 | A1 | 7/2014 | Utsunomiya et al. |
| 2014/0253987 | A1 | 9/2014 | Christmas |
| 2015/0317558 | A1 | 11/2015 | Adachi et al. |
| 2016/0064108 | A1 | 3/2016 | Saffman et al. |
| 2016/0125311 | A1 | 5/2016 | Fuechsle et al. |
| 2016/0328253 | A1 | 11/2016 | Majumdar |
| 2016/0363617 | A1 | 12/2016 | Anderson et al. |
| 2017/0300817 | A1 | 10/2017 | King et al. |
| 2018/0217629 | A1 | 8/2018 | Macfaden |
| 2018/0218279 | A1 | 8/2018 | Lechner et al. |
| 2018/0260731 | A1 | 9/2018 | Zeng et al. |
| 2019/0266508 | A1 | 8/2019 | Bunyk et al. |
| 2020/0185120 | A1 | 6/2020 | Keesling Contreras et al. |
| 2020/0233025 | A1 | 7/2020 | Salim et al. |
| 2021/0279631 | A1 | 9/2021 | Pichler et al. |
| 2021/0365827 | A1 | 11/2021 | Monroe et al. |
| 2021/0383189 | A1 | 12/2021 | Cong et al. |
| 2022/0060668 | A1 | 2/2022 | Kim et al. |
| 2022/0138608 | A1 | 5/2022 | Ramette et al. |
| 2022/0197102 | A1 | 6/2022 | Christen et al. |
| 2022/0293293 | A1 | 9/2022 | Contreras et al. |
| 2022/0391743 | A1 | 12/2022 | Wild et al. |
| 2023/0326623 | A1 | 10/2023 | Keesling Contreras et al. |
| 2024/0029911 | A1 | 1/2024 | Lukin et al. |
| 2024/0185113 | A1 | 6/2024 | Cong et al. |
| 2024/0289665 | A1 | 8/2024 | Pichler et al. |
| 2024/0346352 | A1 | 10/2024 | Bluvstein et al. |
| 2024/0347995 | A1 | 10/2024 | Levine et al. |
| 2025/0005420 | A1* | 1/2025 | Blatt ..................... G06N 10/40 |
| 2025/0378972 | A1* | 12/2025 | Kim ........................ G06N 10/40 |

FOREIGN PATENT DOCUMENTS

| | | |
|---|---|---|
| EP | 1171968 B1 | 11/2002 |
| EP | 3113084 A1 | 1/2017 |
| EP | 3438726 A1 | 2/2019 |
| GB | 0205011 A | 10/1923 |
| JP | 2007/233041 A | 9/2007 |
| JP | 2008/134450 A | 6/2008 |
| JP | 2008/158325 A | 7/2008 |
| JP | 2014-197733 A | 10/2014 |
| JP | 2017/078832 A | 4/2017 |
| JP | 2020528357 A | 9/2020 |
| WO | WO-2014/051886 A1 | 4/2014 |
| WO | WO-2019/014589 A1 | 1/2019 |
| WO | WO-2020/072981 A1 | 4/2020 |
| WO | WO 2020/140148 A1 | 7/2020 |
| WO | WO-2020/172588 A1 | 8/2020 |
| WO | WO-2020/236574 A1 | 11/2020 |
| WO | WO-2021/007560 A1 | 1/2021 |
| WO | WO-2021/141918 A1 | 7/2021 |
| WO | WO-2022/132388 A2 | 6/2022 |
| WO | WO-2022/132389 A2 | 6/2022 |
| WO | WO-2022/174072 A1 | 8/2022 |
| WO | WO-2022/132388 A3 | 9/2022 |
| WO | WO-2022/132389 A3 | 9/2022 |
| WO | WO-2023/287503 A2 | 1/2023 |
| WO | WO-2023/287503 A3 | 1/2023 |
| WO | WO-2023/287503 A9 | 1/2023 |
| WO | WO-2023/080936 A2 | 5/2023 |
| WO | WO-2023/080936 A3 | 7/2023 |
| WO | WO-2023/132865 | 7/2023 |
| WO | WO-2023/132865 A2 | 7/2023 |
| WO | WO-2024/155291 A2 | 7/2024 |

OTHER PUBLICATIONS

Jaksch et al., "Fast quantum gates for neutral atoms." arXiv (2000): 2208.

Keating et al., "Robust quantum logic in neutral atoms via adiabatic Rydberg dressing." Physical Review A 91 (2015): 012337.

Nickerson et al., "Freely scalable quantum technologies using cells of 5-to-50 qubits with very lossy and noisy photonic links." Physical Review X 4.4 (2014): 041041.

Ramette et al., "Fault-tolerant connection of error-corrected qubits with noisy links." npj Quantum Information 10.1 (2024): 58.

Weimer et al. "A Rydberg quantum simulator." Nature Physics 6.5 (2010): 382-388.

Adachi et al., "Application of Quantum Annealing to Training of Deep Neural Networks," arXiv.org: 18 pages (2015).

Aliferis et al., "Computation by measurements: A unifying picture," Arxiv: 13 pages (2004).

Anonymous., "Magneto-optical trap," Wikipedia, retrieved online <https://web.archive.org/web/20210125084412/https://en.wikipedia. org/wiki/Magneto-optical_trap>: 7 pages (2022).

Auger et al., "Blueprint for fault-tolerant quantum computation with Rydberg atoms." Physical Review A 96(5): 052320 (2017).

Barredo et al., "An atom-by-atom assembler of defect-free arbitrary 2d atomic arrays," arXiv:1607.03042, Jul. 11, 2016, pp. 1-7.

Barredo et al., "An atom-by-atom assembler of defect-free arbitrary two-dimensional atomic arrays," Science, 354(6315): 1021-1023 (2016).

Barredo et al., "Synthetic three-dimensional atomic structures assembled atom by atom," Nature, 561: 79-82 (2018).

Baur et al., "Single-Photon Switch Based on Rydberg Blockade," Phys. Rev. Lett., 112: 073901 (2014).

Beugnon et al., "Two-dimensional transport and transfer of a single atomic qubit in optical tweezers" Nature Physics, vol. 3, p. 1-4 (2007).

Brion et al., "Quantum Computing with Collective Ensembles of Multilevel Systems," Phys. Rev. Lett., 99: 260501 (2007).

(56)         References Cited

OTHER PUBLICATIONS

Browaeys et al., "Many-body physics with individually controlled Rydberg atoms," Nature Physics, 16: 132-142 (2020).

Bruzewicz et al., "Trapped-Ion Quantum Computing: Progress and Challenges," Applied Physics Reviews, 6(2): 021314 (2019).

Chao et al., "Fault-tolerant quantum computation with few qubits." npj Quantum Information 4.1 (2018): 42.

Cong et al., "Hardware-efficient, fault-tolerant quantum computation with Rydberg atoms", Physical Review X 12(2): 021049 (2022).

Cong et al., "Quantum convolutional neural networks" Nature Physics, vol. 15, p. 1273-78 (2019).

Couvert et al., "Optimal transport of ultracold atoms in the non-adiabatic regime" Europhysics Letters, 83: 5 pages (2008).

Debnath et al., "Demonstration of a small programmable quantum computer with atomic qubits," Nature, 536(7614): 63-66 (2016).

Dordevic et al., "Entanglement transport and a nanophotonic interface for atoms in optical tweezers" arXiv: 16 pages (2021).

Ebert et al., "Coherence and Rydberg Blockade of Atomic Ensemble Qubits," Phys. Rev. Lett., 115: 093601 (2015).

Endres et al., "Atom-by-atom assembly of defect-free one-dimensional cold atom arrays," Science, 354 (6315): 1024-1027 (2016).

Endres et al., "Cold Matter Assembled Atom-by-Atom," arXiv:1607. 03044, Jul. 11, 2016, pp. 1-12.

Engstrom et al., "Calibration of spatial light modulators suffering from spatially varying phase response," Optics Express, 21(13): 16086-16103 (2013).

Extended European Search Report for EP Application No. 19854402.5 dated May 9, 2022.

Extended European Search Report for EP Application No. 19868908.5 dated Jun. 13, 2022.

Extended European Search Report for EP Application No. EP 18831504 mailed Mar. 30, 2021.

Farhi et al., "Classification with Quantum Neural Networks on Near Term Processors," arXiv:1802.06002, 1-21 (2018).

Fienup., "Phase retrieval algorithms: a comparison," Applied Optics 21(15): 2758-2769 (1982).

Fowler et al., "Surface code quantum communication" arXiv, pp. 1-4 (2010).

Fowler et al., "Surface codes: Towards practical large-scale quantum computation," Phys. Rev. A, 86: 032324 (2012).

Fowler et al., "Surface Codes: Towards practical large-scale quantum computation" Physical Review, vol. 86 (3), p. 1-54 (2012).

Gerchberg et al., "A Practical Algorithm for the Determination of Phase from Image and Diffraction Plane Pictures," Optik, 35(2): 237-246 (1972).

Gorniaczyk et al., "Single-Photon Transistor Mediated by Interstate Rydberg Interactions," Phys. Rev. Lett., 113: 053601 (2014).

Graham et al., "Demonstration of multi-qubit entanglement and algorithms on a programmable neutral atom quantum computer" arXiv, p. 1-25 (2022).

Grant et al., "Hierarchical quantum classifiers" ARXIV, p. 1-16 (2018).

Gunter et al., "Interaction Enhanced Imaging of Individual Rydberg Atoms in Dense Gases," Phys. Rev. Lett., 108: 013002 (2012).

Gunter et al., "Observing the Dynamics of Dipole-Mediated Energy Transport by Interaction-Enhanced Imaging," Science, 342(6161): 954-956 (2013).

Haegeman et al., "Order Parameter for Symmetry-Protected Phases in One Dimension," Phys. Rev. Lett., 109(5): 050402-1-5 (2012).

Haldane,"Nonlinear Field Theory of Large-Spin Heisenberg Antiferromagnets: Semiclassically Quantized Solitons of the One-Dimensional Easy-Axis Neel State," Phys. Rev. Lett., 50(15): 1153-1156 (1983).

Hashizume et al., "Deterministic Fast Scrambling with Neutral Atom Arrays" Physical Review Letters, vol. 126: 14 pages (2021).

International Search Report and Written Opinion for Application No. PCT/US2021/060136 dated Aug. 11, 2022.

International Search Report and Written Opinion for International Application No. PCT/US18/42080 dated Oct. 22, 2018.

International Search Report and Written Opinion for International Application No. PCT/US2019/049115 dated Jan. 7, 2020.

International Search Report and Written Opinion for International Application No. PCT/US2019/054831 dated Feb. 6, 2020.

International Search Report and Written Opinion for International Application No. PCT/US2020/019309 dated Jul. 14, 2020.

International Search Report and Written Opinion for International Application No. PCT/US2020/033100 dated Sep. 2, 2020.

International Search Report and Written Opinion for International Application No. PCT/US2020/041709 dated Oct. 28, 2020.

International Search Report and Written Opinion for International Application No. PCT/US2021/012209 mailed May 3, 2021.

International Search Report and Written Opinion for International Application No. PCT/US2022/016173 dated May 24, 2022.

International Search Report and Written Opinion for International Application No. PCT/US2022/031297 dated Feb. 21, 2023.

International Search Report and Written Opinion of Application No. PCT/US2021/060138 dated Aug. 19, 2022.

Isenhower et al., "Demonstration of a neutral atom controlled-NOT quantum gate," arXiv:0907.5552, Nov. 24, 2009, pp. 1-5.

Jahromi et al., "Topological spin liquids in the ruby lattice with anisotropic Kitaev interactions," Physical Review B, 94(12): (10 pages) (2016).

Jahromi et al., "Topological $Z_2$ RVB quantum spin liquid on the ruby lattice," Physical Review B, 101 (11): (10 pages) (2020).

Jaksch et al., "The cold atom Hubbard toolbox," Arxiv, (30 pages) (2004).

Johnson et al., "Rabi Oscillations between Ground and Rydberg States with Dipole-Dipole Atomic Interactions," Physical Review Letters, 110(11): 113003-1-4 (2008).

Kaufman et al., "Hong-Ou-Mandel atom interferometry in tunnel-coupled optical tweezers," arXiv:1312.7182, Jun. 17, 2014, pp. 1-17.

Kaufman et al., "Quantum thermalization through entanglement in an isolated many-body system" arXiv: 19 pages (2016).

Killoran et al., "Continuous-variable quantum neural networks" ARXIV, p. 1-21 (2018).

Kim and Swingle., "Robust entanglement renormalization on a noisy quantum computer" ARXIV, p. 1-17 (2017).

Labuhn et al., "Realizing quantum Ising models in tunable two-dimensional arrays of single Rydberg atoms" arXiv: 1-12 (2016).

Labuhn et al., "Tunable two-demensional arrays of single Rydberg atoms for realizing quantum Ising models," Nature, 534(7609): 667-670 (2016).

Lengwenus et al., "Coherent Transport of Atomic Quantum in a Scalable Shift Register" Physical Review Letters, 105: 4 pages (2010).

Leonardo et al., "Computer generation of optimal holograms for optical trap arrays," Optics Express, 15(4): 1913-1922 (2007).

Lester et al., "Rapid production of uniformly-filled arrays of neutral atoms," arXiv:1506.04419, Jun. 14, 2015, pp. 1-5.

Low et al., "Practical trapped-ion protocols for universal qudit-based quantum computing", Physical Review Research 2(3): 033128 (2020).

Lu et al., "Aluminum nitride integrated photonics platform for the ultraviolet to visible spectrum," Optics Express, 26(9): 11147 (2018).

Ma et al., "Generation of three-dimensional optical structures by dynamic holograms displayed on a twisted nematic liquid crystal display," Applied Physics B Lasers and Optics, 110(4): 531-537 (2013).

Matsumoto et al., "High-quality generation of a multispot pattern using a spatial light modulator with adaptive feedback," Optics Letters, 37(15): 3135-3137 (2012).

Mazurenko, "Optical Imaging of Rydberg Atoms," Thesis (S.B.)— Massachusetts Institute of Technology, Dept. of Physics (2012).

Mehta et al., "Towards fast and scalable trapped-ion quantum logic with integrated photonics," Proc. SPIE 10933, Advances in Photonics of Quantum Computing, Memory, and Communication XII, 109330B (2019).

(56) References Cited

OTHER PUBLICATIONS

Morgado et al., "Quantum simulation and computing with Rydberg-interacting qubits," Arxiv, Cornell University Library: 36 pages (2020).

Murmann et al., "Two Fermions in a Double Well: Exploring a Fundamental Building Block of the Hubbard Model," arXiv:1410.8784, Feb. 17, 2015, pp. 1-12.

Negretti et al., "Quantum computing implementation with neutral particles," Arxiv, (19 pages) (2011).

Nogrette et al., "Single-Atom Trapping in Holographic 2D Arrays of Microtraps with Arbitrary Geometries," Physical Review X, 4: Article 021034 pp. 1-9 (2014).

Perez-Garcia et al., "PEPS as unique ground states of local Hamiltonians," Quant. Inf. Comp., 8: 0650 (2008).

Persson et al., "An algorithm for improved control of trap intensities in holographic optical tweezers," Proceedings of SPIE, 8458: 8 pages (2012).

Persson et al., "Minimizing intensity fluctuations in dynamic holographic optical tweezers by restricted phase change," Optics Express, 18(11): 11250-11263 (2010).

Persson et al., "Real-time generation of fully optimized holograms for optical trapping applications," Proceedings of SPIE, 8097: 10 pages (2011).

Persson et al., "Reducing the effect of pixel crosstalk in phase only spatial light modulators," Optics Express, 20(20): 22334-22343 (2012).

Persson., "Thesis for the Degree of Doctor of Philosophy: Advances in Holographic Optical Trapping," Department of Physics University o Gothenburg: 82 pages (2013).

Pichler et al., "Computational complexity of the Rydberg blockade in two dimensions," arXiv: 1809.04954 (2018).

Poland et al., "Development of a doubly weighted Gerchberg-Saxton algorithm for use in multibeam imaging applications," Optics Letters, 39(8): 2431-2434 (2014).

Pollmann et al., "Detection of symmetry-protected topological phases in one dimension," Phys. Rev. B, 86(12): 125441-1-13 (2012).

Prongue et al., "Optimized kinoform structures for highly efficient fan-out elements," Applied Optics, 31(26): 5706-5711 (1992).

Rehn et al., "A fractionalised "Z2" classical Heisenberg spin liquid" arXiv: 5 pages (2016).

Reichle et al., "Transport Dynamics of single ions in segmented microstructed Paul trap arrays" Forschritte der Physik Progress of Physics, 54 (8-10): 666-685 (2006).

Saffman et al., "Quantum information with Rydberg atoms," Rev. Mod. Phys., 82(3): 2313-2363 (2010).

Saffman et al., "Scaling the neutral-atom Rydberg gate quantum computer by collective encoding in holmium atoms," Phys. Rev. A, 78: 012336 (2008).

Satzinger et al. "Realizing topologically ordered states on a quantum processor," 27 pages, (2021).

Savary et al., "Quantum Spin Liquids" arXiv: 60 pages (2016).

Shi, "Deutsch, Toffoli, and CNOT Gates via Rydberg Blockade of Neutral Atoms," arxiv.org, Cornell University Library, 201 OLIN Library Cornell University Ithaca, NY (2018).

Shi, "Fast, Accurate, and Realizable Two-Qubit Entangling Gates by Quantum Interference in Detuned Rabi Cycles of Rydberg Atoms," arxiv.org, Cornell University Library, 201 OLIN Library Cornell University Ithaca, NY (2019).

Sorace-Agaskar et al., "Multi-layer integrated photonics from the ultraviolet to the infrared," Proc. SPIE 10510, Frontiers in Biological Detection: From Nanosensors to Systems X, 105100D (2018).

Tamura et al., "Highly uniform holographic microtrap arrays for single atom trapping using a feedback optimization of in-trap fluorescence measurements," Optics Express, 24(8): 8132-8141 (2016).

Tanasittikosol et al., "Microwave dressing of Rydberg dark states," Arxiv, Cornell University Library: 12 pages (2011).

Thimons et al., "Investigating the Gerchberg-Saxton Phase Retrieval Algorithm," SIAM: 11 pages (2018).

Torlai et al., "Integrating Neural Networks with a Quantum Simulator for State Reconstruction," Cornell University Library, (15 pages) (2019).

Urban et al., "Observation of Rydberg blockade between two atoms," Nature Physics, 5: 110-114 (2009).

Verdon et al., "A Universal Training Algorithm for Quantum Deep Learning" ARXIV, p. 1-83, (2018).

Verresen et al., "One-dimensional symmetry protected topological phases and their transitions," Phys. Rev. B, 96(16): 165124-1-23 (2017).

Verstraete et al., "Criticality, the Area Law, and the Computational Power of Projected Entangled Pair States," Phys. Rev. Lett., 96: 220601 (2006).

Vidal, "Class of Quantum Many-Body States That Can Be Efficiently Simulated," Phys. Rev. Lett., 101(11): 110501-1-4 (2008).

Wang et al., "Coherent Addressing of Individual Neutral Atoms in a 3D Optical Lattice," Physical Review Letters, 115(4): 043003-1-5 (2015).

Wu et al., "Erasure conversion for fault-tolerant quantum computing in alkaline earth Rydberg atom arrays," arXiv.org: 16 pages (2022).

Yang et al., "Coherence Preservation of a Single Neutral Atom Qubit Transferred between Magic-Intensity Optical Traps" Physical Review Letter, 117: 6 pages (2016).

Yavuz et al., "Fast Ground State Manipulation of Neutral Atoms in Microscopic Optical Traps," Physical Review Letters, 96(6): 063001-1-4 (2006).

Ying, "Entangled Many-Body States as Resources of Quantum Information Processing," Center for Quantum Technologies National University of Singapore (2013).

Yoder et al., "Universal fault-tolerant gates on concatenated stabilizer codes", Physical Review X 6(3): 031039 (2016).

Zimmermann et al., "High-resolution imaging of ultracold fermions in microscopically tailored optical potentials," arXiv:1011.1004, Apr. 8, 2011, pp. 1-15.

Du et al., "Superconducting circuit probe for analog quantum simulators", *Physical Review A* 92(1): 012330 (2015).

International Search Report and Written Opinion for Application No. PCT/US2022/039189 dated Aug. 4, 2023.

International Search Report and Written Opinion for International Application No. PCT/US22/37325 dated Jun. 16, 2023.

Keating et al., "Adiabatic quantum computation with Rydberg-dressed atoms", Physical Review A 87, 052314, May 2013.

Levine, "Quantum Information Processing and Quantum Simulation with Programmable Rydberg Atom Arrays" The Department of Physics at Harvard University, PHD Thesis (2021).

Meschede, "Quantum engineering with neutral atoms one by one", *Conference on Lasers and Electro-Optics/Pacific Rim*. Optica Publishing Group, 2007.

Wang et al., "Quantum state manipulation of single-Cesium-atom qubit in a micro-optical trap", *Frontiers of Physics* 9: 634-639 (2014).

Willner et al., "Optics and photonics: Key enabling technologies", *Proceedings of the IEEE* 100.Special Centennial Issue: 1604-1643 (2012).

Levine, "Quantum Information Processing and Quantum Simulation with Programmable Rydberg Atom Arrays" The Department of Physics at Harvard University, PHD Thesis, published Jan. 12, 2022.

Monroe et al., "Remapping the quantum frontier." Physics World 21.08 (2008): 32.

Nakagawa, Creation of Entangled States of Atoms Using Laser-Excited Rydberg Atoms and Application to Quantum information. The Review of Laser Engineering, Aug. 22, 2011;39(12):904-9.

* cited by examiner

Angle, θ [°]

ULTRAFAST DETECTOR OF RYDBERG ATOMS

CROSS-REFERENCE TO RELATED APPLICATIONS

This application is a continuation of Internation Application No. PCT/US2022/016173, filed Feb. 11, 2022, which claims the benefit of U.S. Provisional Application No. 63/148,995, filed Feb. 12, 2021, each of which is hereby incorporated by reference in its entirety.

STATEMENT REGARDING FEDERALLY SPONSORED RESEARCH OR DEVELOPMENT

This invention was made with government support under 1125846 and 1506284 awarded by National Science Foundation (NSF) and under W911NF-20-1-0021 and W911NF-15-2-0067 awarded by U.S. Army Research Office (ARO) and under D18AC00037 awarded by U.S. Department of Defense/Defense Advanced Research Projects Agency (DOD/DARPA). The government has certain rights in the invention.

BACKGROUND

Embodiments of the present disclosure relate to Rydberg atom based quantum computation, and more specifically, to ultrafast detection of Rydberg atoms.

BRIEF SUMMARY

In an example embodiment, the present invention is a device, comprising: at least one monochromatic light source configured to generate a first optical trap; an ensemble of particles disposed in the first optical trap, each particle of the ensemble of particles being excitable to a first Rydberg state and a second Rydberg state, the second Rydberg state having a blockade radius, each particle of the ensemble of particles being within the blockade radius of each other and within the blockade radius of an atomic qubit, the atomic qubit being a particle that is excitable to the second Rydberg state, the ensemble of particles having a first transmissivity at a first wavelength when neither any particle of the ensemble of particles nor the atomic qubit is in the second Rydberg state, the ensemble of particles having a second transmissivity at the first wavelength when the atomic qubit is in the second Rydberg state, the second transmissivity being lower than the first transmissivity; and a second monochromatic light source configured to drive each particle of the ensemble of particles into the first Rydberg state; a probe light source configured to direct a probe beam having the first wavelength to the ensemble of particles; and a photosensor configured to determine the state of the atomic qubit.

In another example embodiment, the present invention is a device, comprising: at least a first monochromatic light source configured to generate a first array of optical traps, each optical trap of the first array of optical traps having an ensemble of particles disposed therein; at least a second monochromatic light source configured to generate a second array of optical traps, wherein: each particle of each of the ensembles of particles being excitable to a first Rydberg state and a second Rydberg state, the second Rydberg state having a blockade radius, each particle of each of the ensembles of particles being within the blockade radius of the second Rydberg state of each particle in its ensemble, and of at least one optical trap of the second array of optical traps, the at least one optical trap of the second array having an atomic qubit disposed therein, the atomic qubit being a particle that is excitable to the second Rydberg state, each ensemble of particles having a first transmissivity at a first wavelength when none of its particles is in the second Rydberg state, each ensemble of particles having a second transmissivity at the first wavelength when one particle in the at least one optical trap of the second array of optical traps is in the second Rydberg state, the second transmissivity being lower than the first transmissivity, each particle of each ensemble of particles being outside the blockade radius of the second Rydberg state of each particle of any other ensemble of particles; at least a third monochromatic light source configured to drive each particle of each ensemble of particles into the first Rydberg state; a probe light source configured to direct a probe beam having the first wavelength to the ensembles of particles; and a photosensor configured to determine a quantum mechanical state of at least one particles in the ensembles of particles.

In yet another example embodiment, the present invention is a method of determining a state of an atomic qubit. The method comprises: disposing an ensemble of particles proximate to an atomic qubit, wherein: each particle of the ensemble of particles being excitable to a first Rydberg state and a second Rydberg state, the second Rydberg state having a second blockade radius, the atomic qubit being a particle that is excitable to the second Rydberg state, each particle of the ensemble of particles being within the second Rydberg state blockade radius of each other and within the second Rydberg state blockade radius of the atomic qubit, the ensemble of particles having a first transmissivity at a first wavelength when neither any particle of the ensemble of particles nor the atomic qubit is in the second Rydberg state, the ensemble of particles having a second transmissivity at the first wavelength when the atomic qubit is in the second Rydberg state, the second transmissivity being lower than the first transmissivity; driving any one particle of the ensemble of particles into the first Rydberg state; directing a probe beam having the first wavelength to the ensemble of particles; and determining the state of the atomic qubit.

DETAILED DESCRIPTION

Figure 1A:
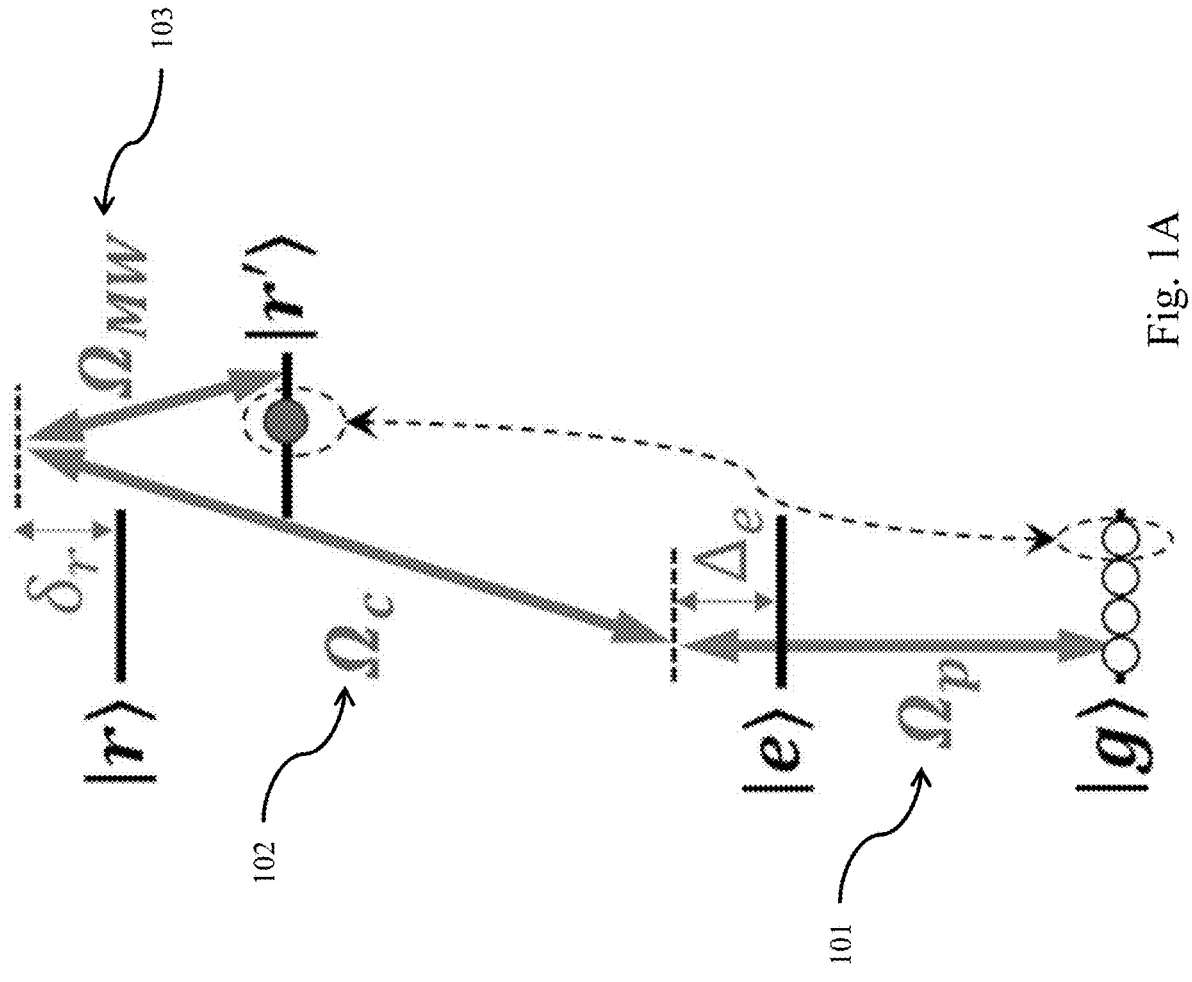
FIG. 1A is a schematic view of a state initialization according to embodiments of the present disclosure.

The present disclosure provides a new approach for fast preparation, manipulation, and collective readout of an atomic Rydberg-state qubit. By making use of Rydberg blockade inside a small atomic ensemble, a single qubit is prepared within 3 μs with a success probability of $F_p=0.93\pm0.02$. The qubit is manipulated, and its state is read out in 6 μs with a single-shot fidelity of $F_d=0.92\pm0.04$. The ensemble-assisted collective optical readout speeds up state detection by a factor of $10^3$ compared to imaging of a single atom. Qubit coherence times of 18 μs are observed, much longer than the π rotation time of 90 ns. The approaches provided herein may enable significantly faster quantum simulation in atomic arrays, as well as quantum error correction.

Fast and reliable state initialization and readout of qubits are essential requirements for implementing scalable quantum information systems. Individually-controlled highly excited Rydberg atoms are a promising platform for quantum simulation and computation. These are enabled by the strong coherent interaction between Rydberg atoms at distances exceeding several micrometers. In combination with the demonstrated ability to deterministically assemble large arrays of individual atoms, Rydberg-atom arrays may be used to simulate quantum spin models with more than 50 qubits, to perform multiple-qubit gate operations, or to create large maximally entangled states. While these quantum simulation and computation systems can operate on microsecond time scales, they could benefit substantially from faster qubit preparation and detection, as both the array preparation process and the optical state readout in alternative systems require several to many milliseconds. Moreover, fast and high-fidelity single-shot qubit readout without atom loss could enable a new generation of experiments with error mitigation, such as quantum error correction and fault tolerant quantum processing.

Alternative approaches for individual Rydberg qubit detection include state-dependent ionization and detection of the ions, a relatively fast (τ~0.1 ms) process that has only moderate fidelity, and the state-dependent removal of atoms followed by relatively slow (τ~10 ms) fluorescence imaging of the remaining atoms with fidelities of F≥0.95. While fast high-intensity fluorescence readout within 20 μs with single-atom resolution is possible, this method is not compatible with atomic arrays, as it does not have the necessary spatial resolution and also requires a large magnetic field. Both ion detection and fluorescence imaging are destructive readout processes, and require a new atomic array to be prepared subsequently, further limiting the cycle time of the quantum processor.

In the present disclosure, high-fidelity preparation, manipulation and detection of a single-Rydberg-atom qubit (not a collective state) inside an atomic ensemble is provided on the microsecond time scale. Starting with N~400 trapped ultracold $^{87}$Rb atoms, a qubit is prepared between the Rydberg states $|r'\rangle \equiv |91P_{3/2}, m_j=3/2\rangle$ and $|r\rangle \equiv |92S_{1/2}, m_j=1/2\rangle$. Qubit rotations are performed with a loss of contrast $\delta C \leq 2\times10^{-3}$ per 2π pulse. The state is read out optically. Harnessing the collective effect of Rydberg blockade, the state preparation and detection are performed in $T_p=3$ μs and $T_d=6$ μs with fidelities of $F_p=0.93\pm0.02$ and $F_d=0.92\pm0.04$, respectively. The measured qubit coherence time of $\tau_c=(15\pm5)$ μs is much longer than the π rotation time of 90 ns.

It should be understood that the methods and devices described herein can employ atoms other than Rb, and that more than one species of atoms can be used. The Rydberg blockade is the source of the enhanced detection and it is not unique to Rb atoms. In an example embodiment, a combination of two different Alkali earth atoms can be used that have similar energy spacing to create a Rydberg blockade radius across species. An example of this is a Cs—Rb Rydberg blockade (see, I. I. Beterov and M. Saffman Phys. Rev. A 92, 042710 (2015)). The use of such a combination would prevent excitation cross talk between the ensemble and the target qubit. The different atomic species require different laser wavelengths to excite to the Rydberg state. Methods and devices described herein allow for the independent manipulation of atomic species.

The approaches provided herein harness collective phenomena for speeding up both state preparation and detection. The preparation is accomplished by application of an appropriate laser pulse to an ensemble of N atoms, such that any atom can be excited to the Rydberg state, yielding N times faster excitation of the first atom to the Rydberg state than for a single atom, while the preparation of a single excitation is ensured by the Rydberg blockade mechanism. Similarly, the signal-to-noise ratio in optical detection is collectively enhanced by a factor of about N, that is, depending on the state of the single-atom Rydberg qubit, the absorption of probe light by all of the N atoms in the ensemble is simultaneously switched on or off.

Figure 1B:
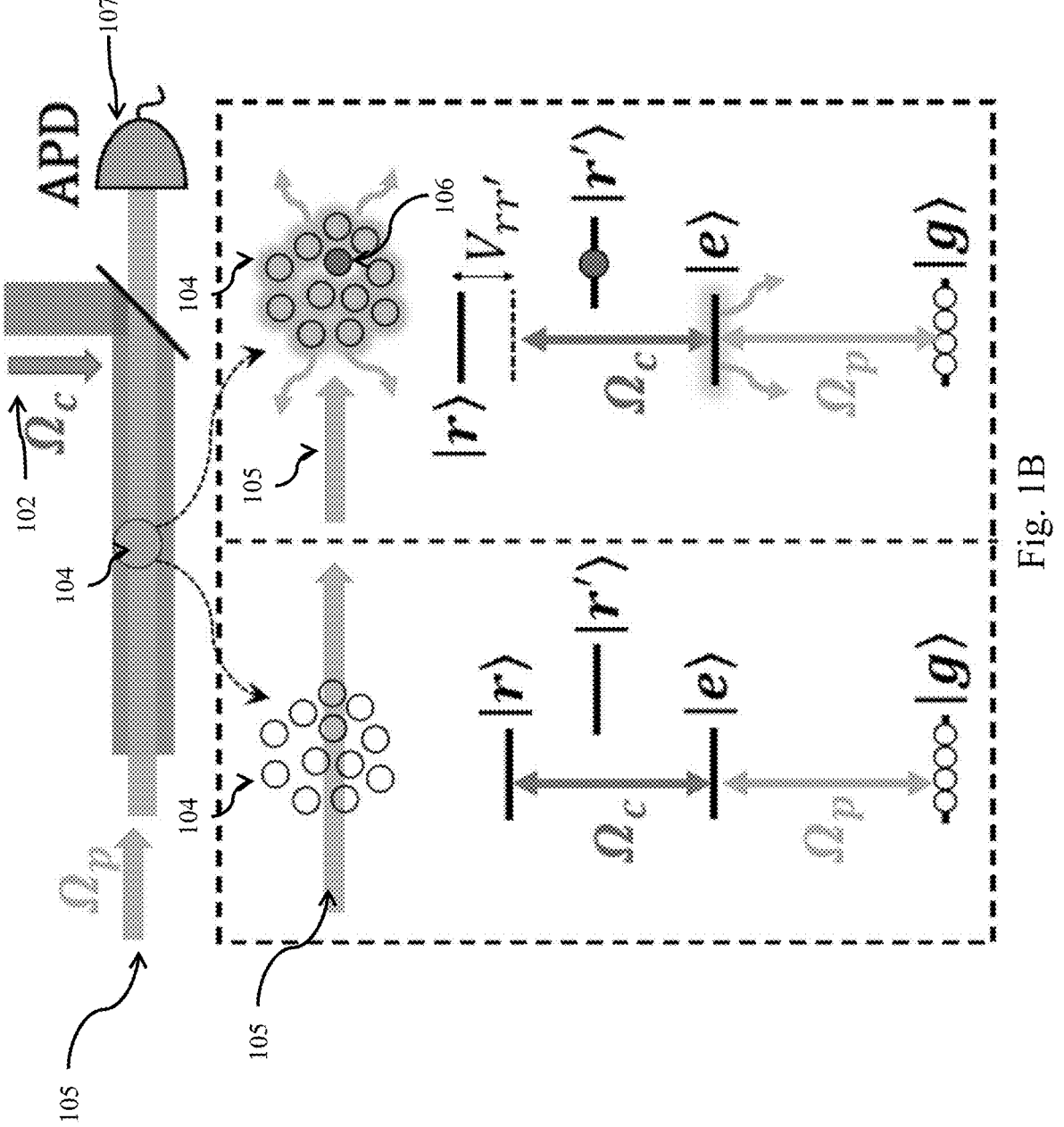
FIG. 1B is a schematic view of an ensemble of atoms having switchable transmissivity according to embodiments of the present disclosure.

Referring to FIGS. 1A-1B, a fast collective detector of a single Rydberg atom is illustrated. FIG. 1A is a schematic view of a state initialization. An atom is prepared in the Rydberg state $|r'\rangle$ through a three-photon process involving the preparation beam ($\Omega_p$, 101), the control beam ($\Omega_c$, 102), and a microwave field ($\Omega_{MW}$, 103). The detunings from the two intermediate states are $\Delta_e=\delta_r=2\pi\times100$ MHz. The preparation of a single atom in $|r'\rangle$ is ensured by the strong interaction between two atoms in $|r'\rangle$. The values of detuning from the two intermediate states need not be equal to each other; this condition enables using the same laser frequency for the control beam during detection as described further below.

The values of detuning and Rabi frequencies during the preparation step can, in some embodiments, be optimized to ensure that the following three conditions are satisfied:

1. The values of detuning is as high possible from both $|r\rangle$ and $|e\rangle$ states to minimize scattering from those two states by having $\Delta_e = \delta_r \gg 0$.

2. As the detuning is increased, the overall transition narrows down. This requires larger Rabi frequency $\Omega_c$, in order to create the Rydberg excitation within the preparation window of time.

3. As $\Omega_c$ is increased, the blockade radius decreases by $\Omega_c^{1/3}$, and therefore $\Omega_c$ is selected to be as small as possible while still blockading the entire ensemble.

Alternatively, a two photon process can be used in which two distinct optical Rydberg wavelengths are used to couple to distinct Rydberg states. Examples of Rydberg states are $|r = 92S\rangle$ and $|r' = 91S\rangle$, which have the energy difference of $\Delta E = 9.5$ GHz.

FIG. 1B is a schematic view of an ensemble of atoms 104 and its transmissivity. A probe field (105, waist size $w_p = 4.5$ μm) in combination with the control field (102, waist size $w_c = 12.5$ μm) couples atoms to the first Rydberg state $|r\rangle$. The waist size of the control beam 102 is configured to uniformly illuminate the ensemble 104. The waist size of the probe beam 105 is configured to be smaller than and ideally centered on the ensemble 104. Under conditions of electromagnetically induced transparency (EIT) ($\Delta_e = \delta_r = 0$), high transmission through the atomic medium results in a large number of detected photons (left detail). On the other hand, if the second Rydberg state $|r'\rangle$ is populated by an atomic qubit 106 (right detail), then the strong interaction between $|r\rangle$ and $|r'\rangle$ removes the EIT condition, resulting in a significant reduction of transmitted photon number due to absorption by the ensemble. The interaction $V_{rr'}$ contains both dipolar-exchange and van-der-Waals components.

As illustrated in FIG. 1A, a small ensemble with root-mean-square (rms) size of $\sqrt{\langle r^2 \rangle} \approx 6$ μm containing typically N~400 laser-cooled $^{87}$Rb atoms is prepared inside a two-beam optical dipole trap with waist sizes $w_1 = 10$ μm and $w_2 = 20$ μm. The atoms are optically pumped into the hyperfine and magnetic sublevel $|g\rangle = |5S_{1/2}, F=2, m_F=2\rangle$ that is coupled via a two-photon process involving the transitions $|g\rangle \leftrightarrow |e\rangle = |5P_{3/2}, F=3, m_F=3\rangle$ (preparation beam $\Omega_p$) and $|e\rangle \leftrightarrow |r\rangle$ (control beam $\Omega_c$) to the Rydberg state $|r\rangle = |92S_{1/2}, m_j=1/2\rangle$ When the two-photon transition is resonant with the intermediate state ($\Delta_e = 0$, see FIG. 1A), the transmitted probe light serves for Rydberg state detection under conditions of electromagnetically induced transparency (EIT). As described above, and shown in FIG. 1B (left detail), if neither any particle of the ensemble 104 nor the atomic qubit 106 is in the second Rydberg state $|r'\rangle$, then the ensemble 104 exhibits a high (first) transmissivity of the probe beam 105 on EIT resonance, while, as shown in FIG. 1B (right detail), when the atomic qubit 106 is in the second Rydberg state $|r'\rangle$, then the ensemble 104 has a low (second) transmissivity of the probe beam 105, lower than the first transmissivity. A photosensor 107 determines the state of the atomic qubit 106. In one embodiment, as shown in FIG. 1B, the photosensor 107 is configured to measure the transmission of the probe beam 105.

Figure 1C:
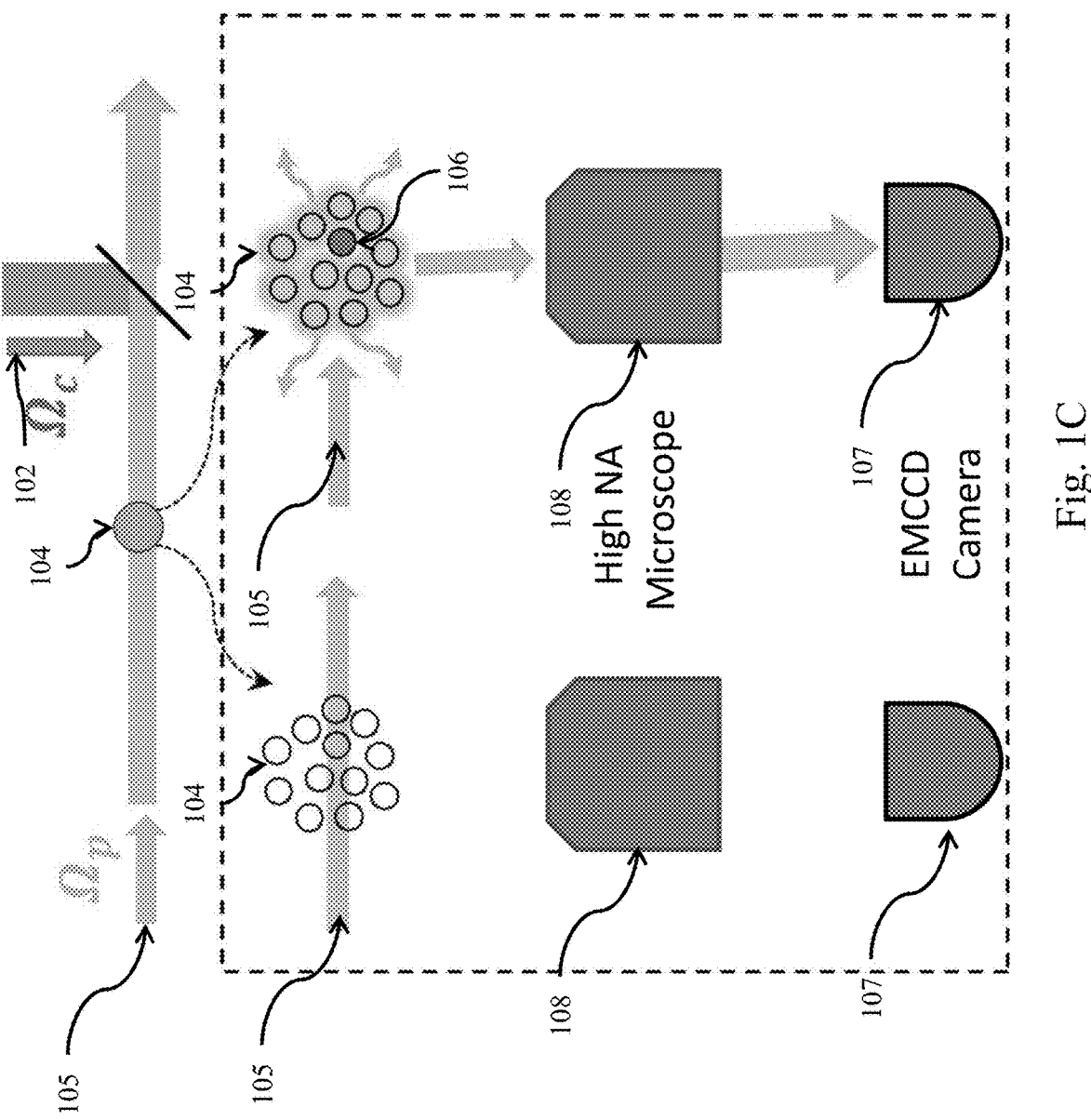
FIG. 1C is a schematic view of an ensemble of atoms having switchable transmissivity and fluorescence detection according to embodiments of the present disclosure.

In another embodiment, as shown in FIG. 1C, the photosensor 107 is configured to measure fluorescence of the ensemble of particles 104 at the probe (first) wavelength 105. For detection of fluorescent light, the collection of light is done by imaging the ensemble of particles 104 with a high-numerical aperture lens (NA>0.5) such as a microscope objective 108 onto a EMCCD camera 107. The collected fluorescence serves as the amplified signal, since the amount of light scattered is proportional to the number of atoms in the ensemble. All detection statistics described before apply with this method.

To prepare a single atom in the Rydberg state $|r'\rangle = |91P_{3/2}, m_j=3/2\rangle$ inside the ensemble, the probe laser and microwave field are detuned by $\Delta_e/(2\pi) = \delta_r/(2\pi) = 100$ MHz from their respective transitions, and in combination with the control field drive a three-photon transition $|g\rangle \leftrightarrow |e\rangle \leftrightarrow |r\rangle \leftrightarrow |r'\rangle$ (see FIG. 1A). By changing the powers of the two optical fields within ~2 μs, a process similar to stimulated Raman adiabatic passage (STIRAP) is realized. This process is chosen over direct excitation because it is less sensitive to laser noise and atom number fluctuations. The observed linewidth $\Gamma_3/(2\pi) = 0.6$ MHz of the three-photon transition corresponds to a blockade radius of $R_{r'r} \sim 15$ μm for the preparation process, larger than the rms distance $d_0 = \sqrt{2\langle r^2 \rangle} = 8.4$ μm between any two atoms in the ensemble. This ensures that excitations of two or more atoms to the Rydberg state $|r'\rangle$ are suppressed.

Figure 2A:
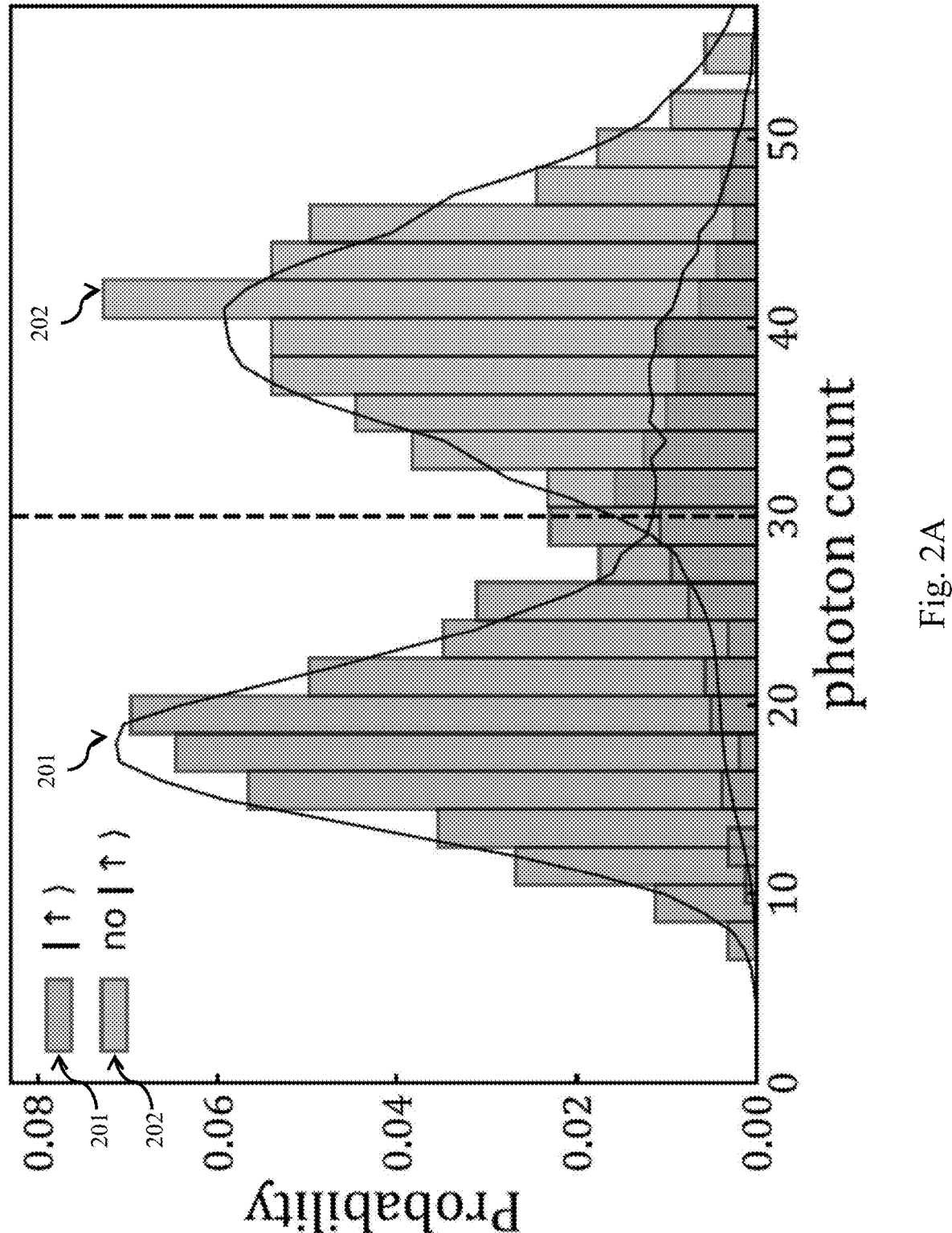
FIG. 2A is a histogram of transmitted probe photon number for state detection according to embodiments of the present disclosure.
Figure 2B:
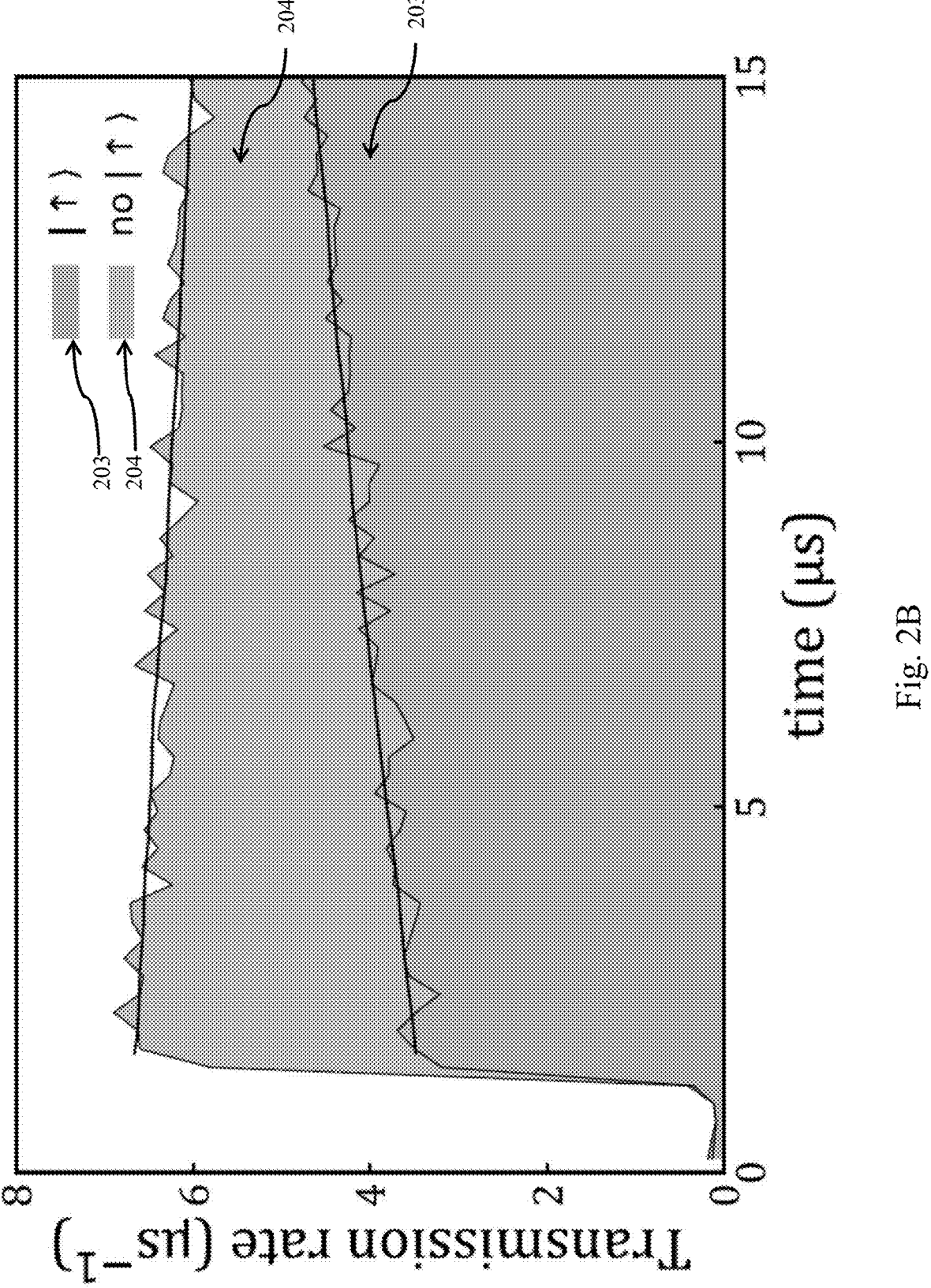
FIG. 2B is a plot of transmitted probe photon number for state detection according to embodiments of the present disclosure.
Figure 2C:
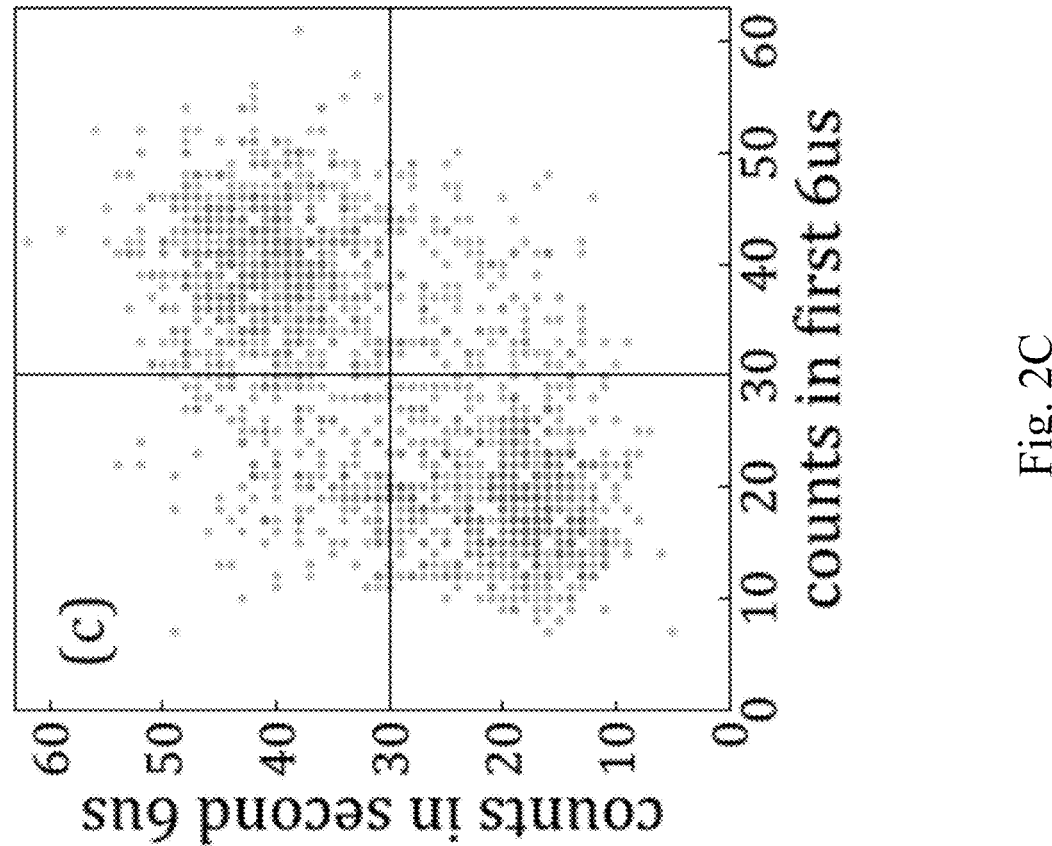
FIG. 2C is correlation plot of detected-photon counts according to embodiments of the present disclosure.

Referring to FIG. 2A, a histogram is provided of the transmitted probe photon number for state detection performed in 6 μs. Histograms 201 and 202 correspond to the presence (state $|\uparrow\rangle$) and absence of an atom in Rydberg state $|r'\rangle$, respectively. The solid lines in FIGS. 2A-B indicate a theoretical model that for the presence (absence) of an atom in $|r'\rangle$ assumes random sudden ionization of the Rydberg atom in $|r'\rangle$ (sudden decay of the slow-light polariton into a Rydberg state) at a rate 0.035 $\mu s^{-1}$ (0.015 $\mu s^{-1}$). The dashed line indicates the detection threshold that equalizes the errors for misidentifying the underlying two states. The control Rabi frequency is $\Omega_c/(2\pi) = 25$ MHz, and the probabilities for collecting and detecting a transmitted probe photon are 0.95 and 0.43 respectively. FIG. 2B is a graph of time-resolved photon count rate during detection, where 203 and 204 correspond to the presence (state $|\uparrow\rangle$) and absence of an atom in Rydberg state $|r'\rangle$, respectively. FIG. 2C is a correlation plot of number of detected-photon counts in two consecutive 6 μs measurements in the same run of the experiment. Gray points concentrated in the lower left (upper right) quadrant represent transmission data when preparing (not preparing) the $|\uparrow\rangle$ state. Vertical and horizontal lines represent threshold counts for state discrimination.

The collectively enhanced optical detection of an atom in $|r'\rangle$ is based on Rydberg EIT in the ladder system $|g\rangle \leftrightarrow |e\rangle \leftrightarrow |r\rangle$ In for the atomic ensemble, which is sensitive to the presence of an individual atom in $|r'\rangle$. If the state $|r'\rangle$ is not populated, the ensemble exhibits a high transmission $T \approx 0.95$ on EIT resonance, while in the presence of an atom in $|r'\rangle$, the transmission is reduced to $T \approx 0.43$: the presence of just one Rydberg atom in $|r'\rangle$ dramatically changes the optical absorption of the entire atomic ensemble (FIG. 1B and FIGS. 2A-B). The transmission change is a consequence of the strong interaction between atoms in the highly excited Rydberg states $|r\rangle$ and $|r'\rangle$ that shifts the state $|r\rangle$ away from EIT resonance. This interaction at distance d is given by $V_{rr'} = C_6/d^6 \pm C_3/d^3$ with $C_6/h = 6310$ GHz·μm$^6$ and $C_3/h = 23.6$ GHz·μm$^3$, corresponding to a frequency shift of the EIT transition by $V_{rr'}/h$ larger than 40 MHz at the rms distance $d = d_0$ between atoms in the ensemble. This shift is comparable to the observed linewidth of $\Gamma_{EIT}/(2\pi) = 26$ MHz for a control Rabi frequency $\Omega_c/(2\pi)=25$ MHz. These interactions are not unique to Rb—Rb molecular states. As an example, one could use a Cs133 atom coupled to the Rydberg state|91S> with a Rb87 atom coupled to the Rydberg state |90S>, and thereby one can have interaction strengths of $$\frac{C3}{h} \sim 81.55 \text{ GHz} \times \mu\text{m}^3 \text{ and } \frac{C6}{h} \sim 7638 \text{ GHz} \times \mu\text{m}^6.$$

The value of $\Omega_c$ is chosen to maximize the signal-to-noise ratio (SNR) by trading off two competing effects: the transmission change depends on the ratio of the blockade radius $R_{rr} \propto \Omega_c^{-1/3}$ to the ensemble size $d_0$, which favors small $\Omega_c$. Fast detection, on the other hand, requires large $\Omega_c$ to increase the group velocity $v_g \propto \Omega_c^2$ of the EIT polaritons that are subject to self-blockade in the atomic medium. It will be appreciated that while in this example, transmission of 0.95 and 0.43 are measured, alternative differences in transmission remain suitable for qubit detection as set out herein. For example, a transmission of 0.9 or higher on EIT resonance, with a transmission of 0.5 or lower otherwise, would allow qubit state detection.

In the following, the Rydberg state $|r'\rangle$ is associated with the $|\uparrow\rangle$ state of an effective spin $$-\frac{1}{2}$$

system. FIG. 2A shows the observed photon count histograms of the transmitted light in a 6-μs detection window with (201) and without (202) an atom in $|r'\rangle$. Even in such a short time, the two distributions 201 and 202 can be clearly distinguished. The time-resolved average count rate (FIG. 2B) reveals that the transmission 203 $T_{|\uparrow\rangle}$ for $|\uparrow\rangle$ increases with time, whereas the high transmission 204 without an atom in $|r'\rangle$ is almost constant, and decreases only slowly. The linear slope in the time-averaged transmission $T_{|\uparrow\rangle}$ in FIG. 2B can be explained by a light-induced loss process of the Rydberg atom in $|\uparrow\rangle$ during detection, which leads to a sudden increase in transmission at a random time. Such loss is likely due to direct photo-ionization by the control light, and to a lesser part to an auto-ionization process in a collision with one of the slow-light Rydberg polaritons (with a Rydberg component $|r\rangle$) during detection. The gradual reduction of T without an atom in $|r'\rangle$ may be due to decay of the slow-light $|r\rangle$-polaritons to other Rydberg states, producing randomly a stationary atom in some Rydberg state, that then blocks the EIT transmission.

A model that includes the random loss of the atom in $|r'\rangle$ yields excellent agreement with the photon count histograms observed at different detection times. Using this model a preparation fidelity may be inferred for the state $|\uparrow\rangle$ (an atom in $|r'\rangle$) of $F_p=0.93\pm0.02$. The detection fidelity (probability of correctly identifying the underlying state IT)) after removing the state preparation error is then $F_d=0.92\pm0.04$.

FIG. 2C demonstrates that repeated ('non-destructive') measurements can be performed on the system, where a second 6 μs measurement yields good agreement with the first measurement: The average conditional probability for the second measurement to have the same outcome as the first measurement is p=0.79±0.03. The detection system can also be viewed as a single-atom transistor for light. A gain of G=17±1 is achieved in 6 μs.

A qubit is implemented in such a system by defining the state with a single atom in $|r\rangle$ as the $|\downarrow\rangle$ state. Coherent rotations in the $\{|\uparrow\rangle, |75\rangle\}$ manifold can be induced by the microwave field. After a qubit rotation, the resulting state is detected by turning on the coupling light slightly (1 μs) earlier than the probe light, such that the state $|r\rangle$ is quickly de-excited by the strong coupling laser to the unstable state $|e\rangle$, which decays by photon emission in 30 ns (see FIGS. 1A-B). Thus, as far as the detection process is concerned, the state $|\downarrow\rangle$ (atom in $|r\rangle$) is equivalent to having no Rydberg excitation at all, while the state $|\uparrow\rangle$ (atom in $|r'\rangle$) remains unaffected by the detection light, and leads to Rydberg blockade of the probe transmission. If the photon count is above or below a chosen detection threshold (see FIG. 2A), the qubit state is identified as $|\downarrow\rangle$ or $|\uparrow\rangle$, respectively.

Figure 3:
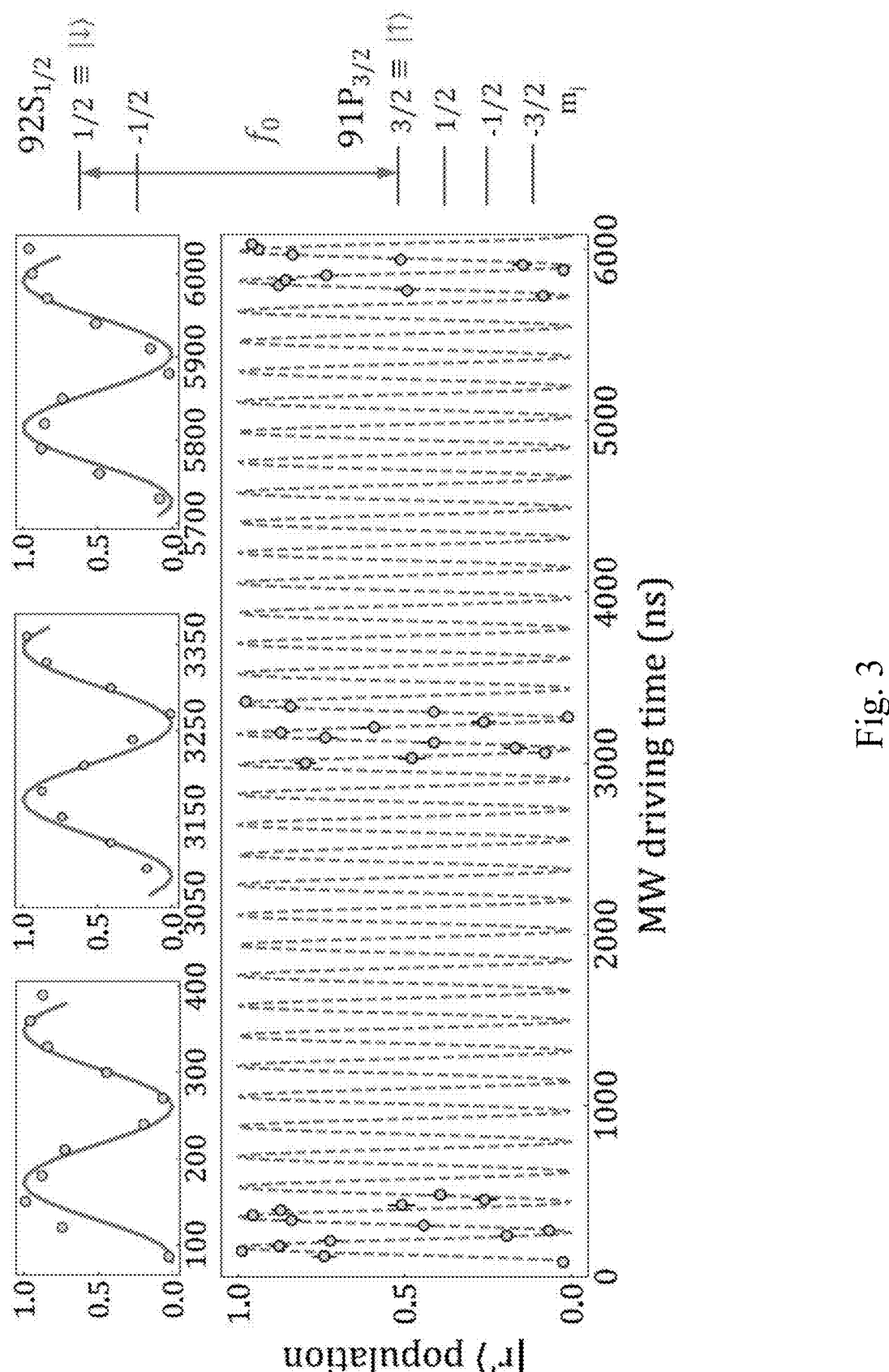
FIG. 3 is a set of graphs of $|r'\rangle$ population over time according to embodiments of the present disclosure.

FIG. 3 is a set of graphs of $|r'\rangle$ population over time, with an associated energy level diagram. A microwave field at a frequency f 0=4814.2 MHz is applied to drive Rabi oscillations between $|r'\rangle$ and $|r'\rangle$ at an oscillation frequency $\Omega/(2\pi)=5.3$ MHz. Each point is an average of ~150 repetitions. The error bars are the standard deviation of the mean. The fitted contrast loss per $2\pi$ pulse is $\delta C=(1\pm1)\times10^{-3}$. The relevant energy level diagrams are shown on the right.

FIG. 3 shows Rabi oscillations with the full sequence of state preparation, qubit rotation, and detection. Since the trapping light creates a repulsive potential for the Rydberg states, the trap is turned off during the entire sequence, which puts a constraint on the operation time. This limitation could be alleviated in the future by the use of recently developed techniques of optical trapping using ponderomotive forces. Two microwave antennas are used with adjusted relative phase and amplitude to suppress the $\pi$ polarization component of the microwave field that can couple atoms on $|\downarrow\rangle$ to the magnetic sublevel $m_j=1/2$ in the $|91P_{3/2}\rangle$ manifold, offset by 17 MHz in an applied magnetic field of 10 G. The remaining coupling to other magnetic sublevels limits the maximum Rabi frequency on the $|\uparrow\rangle \leftrightarrow |\downarrow\rangle$ transition to less than ~5 MHz. The Rabi oscillations show no observable damping on the 6 μs timescale, corresponding to a contrast loss per $2\pi$ pulse of $\delta C=(1\pm1)\times10^{-3}$.

The observed contrast of the Rabi oscillations can be used to determine the probability that two excitations in $|r'\rangle$ were simultaneously created in the ensemble. Due to the large interaction energy $V_{rr}(d)=C_6/r^6 \pm C_3/r^3$ between two atoms in $|r'\rangle$ and $|n\rangle$, the Rabi oscillations with two excitations would very quickly wash out on a time scale $h/V_{rr}(d_0) \sim 40$ ns. From the observed contrast of the Rabi oscillation it may be concluded that the probability for preparing two excitations is below 1%.

Figure 4:
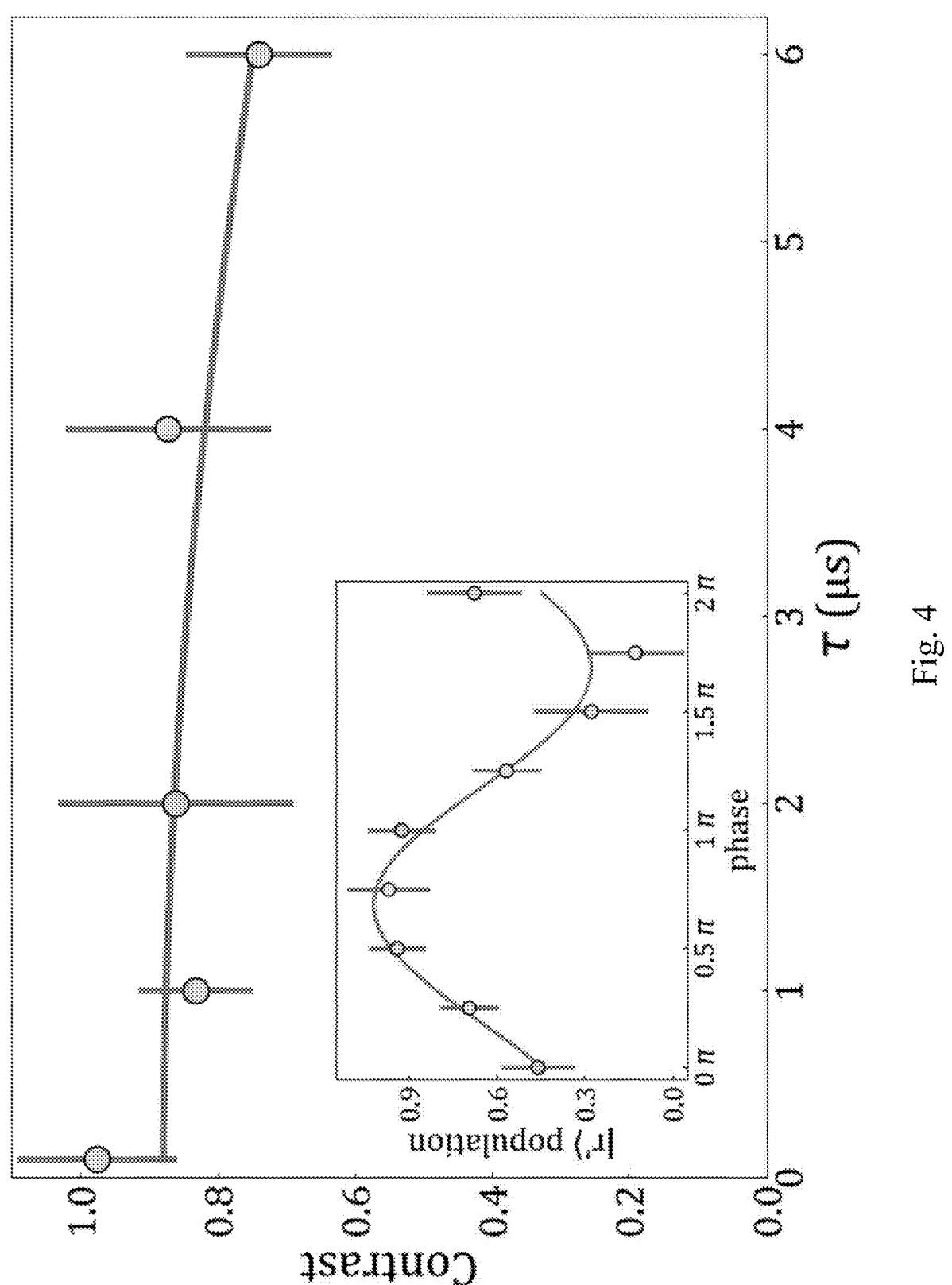
FIG. 4 is a graph of contrast over time according to embodiments of the present disclosure.

A Ramsey measurement is used to characterize the coherence time of the Rydberg qubit embedded inside the atomic cloud. Two $\pi/2$ pulses are applied with a temporal separation T between them, and their relative phase is scanned to obtain a Ramsey fringe at given T. FIG. 4 displays the contrast of the Ramsey fringes as a function of Ramsey time T. By fitting the contrast to a Gaussian decay function, the $e^{-1}$ dephasing time is given as $(15\pm5)\mu s$. Possible dephasing mechanisms include electric-field fluctuations acting on the highly polarizable Rydberg states, magnetic field fluctuations, and interactions between the Rydberg atom and the surrounding ground state atoms.

FIG. 4 is a graph of contrast over time, showing Ramsey measurements consisting of two $\pi/2$ pulses separated by a time T. The phase of the second $\pi/2$ pulse is scanned to obtain a Ramsey fringe. The contrast of the Ramsey fringe is plotted as a function of $\tau$. The solid curve is a fit to a Gaussian decay function $Ae^{-(\Sigma/T^*)^2}$, yielding a dephasing time $T_2^*=(15\pm5)$ µs and $A=0.88\pm0.04$. The inset shows the Ramsey fringe at $\tau=1000$ ns.

By harnessing collective effects in a small atomic ensemble, the present disclosure demonstrates methods for the rapid preparation and detection of a Rydberg qubit. The preparation fidelity for a single excitation can be improved by using a smaller ensemble size, since such ensembles would provide even higher energy cost for multiple excitations. The size of the ensemble cannot, however, be made arbitrarily small, since at higher atomic densities, necessary to maintain the same optical depth OD~1, Rydberg molecule formation could lead to loss. Given atomic densities of $\langle n \rangle = 2\times10^{11}$ cm$^{-3}$, reducing the ensemble size by a factor of 2 should be possible, which would likely reduce the preparation error by more than an order of magnitude. In general, atomic density of less than $\langle n \rangle = 1\times10^{13}$ cm$^{-3}$ are suitable. Densities higher than this are likely to form Rydberg molecules, which inhibit detection. As used herein, the term optical depth takes its ordinary meaning, the natural logarithm of the ratio of incident to transmitted radiant power through a material. While in some embodiments, an optical depth of about 1 is provided, an optical depth of about 1 to 1.5 is suitable.

Detection fidelity, on the other hand, is limited by the loss of the Rydberg atom prepared in the $|r'\rangle$ state. This loss is mainly caused by the control light in the detection stage, and thus can be mitigated by using two ensembles, one for hosting the qubit and the other for detection, located within a blockade radius from each other. This configuration allows for a non-destructive, fast qubit readout with detection fidelity over 99%, a crucial tool necessary for implementing quantum error correction. In addition, such a readout can also enable studies of quantum feedback, quantum Zeno effect, quantum jumps, and can act as a fast probe of Rydberg super-atom dynamics. The detection scheme can be readily implemented in different Rydberg platforms, and can speed up the optical readout by several orders of magnitude. By scaling up the approach used here to large arrays of small ensembles, the strong Rydberg-Rydberg interactions can be used for multiqubit operations, the study of many-body systems, and in general as a versatile platform for high-fidelity quantum information processing at high speed.

When applied to an ensemble larger than the Rydberg blockade radius, the techniques provided herein permit direct imaging of individual Rydberg atoms inside an ensemble.

EXPERIMENTAL SETUP $^{87}$Rb atoms are collected in a three-dimensional magneto-optical trap (MOT) and loaded into a crossed optical dipole trap created with two orthogonal far-detuned laser beams at wavelengths 852 nm (propagating along z) and 1064 nm (propagating along y) with waist sizes $w_1=10$ µm and $w_2=20$ µm, respectively, providing individual trap depths of typically $U_{852}/h=2$ MHz and $U_{1064}/h=20$ MHz. The trap vibration frequencies are $\omega_x/(2\pi)=5.7$ kHz, $\omega_y/(2\pi)=3.0$ kHz and $\omega_z(2\pi)=4.8$ kHz. The probe propagates in the xy plane at an angle of 16° to the y axis. The cloud is cooled to 80 µK using polarization gradient cooling, resulting in root-mean-squared (RMS) sizes of $x_0=2.4$ µm, $y_0=4.6$ µm, $z_0=2.9$ µm for the ensemble. The rms distance between two atoms in the ensemble is then $d_0=\sqrt{2(x_0^2+y_0^2+z_0^2)}=8.4$ µm. The total absorption on the $|5S_{1/2}, F=2, m_F=2\rangle \rightarrow |5P_{3/2}, F=3, m_F=3\rangle$ transition corresponds to $N_0=440$ atoms if the atomic cross section is assumed to be reduced by various broadening mechanisms by a factor of 2 from its maximum value $\sigma_0=3\lambda^2/(2\pi)$, where $\lambda_0=780$ nm is the wavelength of the probe transition. A magnetic field of 10 G is applied along the direction of propagation of the probe beam to define the quantization axis and split the magnetic sublevels of the Rydberg states. The optical dipole traps are turned off during state preparation, rotation, and detection to prevent broadening of the transition due to inhomogeneous light shifts of the ground and Rydberg states.

Preparation of an Atom in the Rydberg State

Figure 5A:
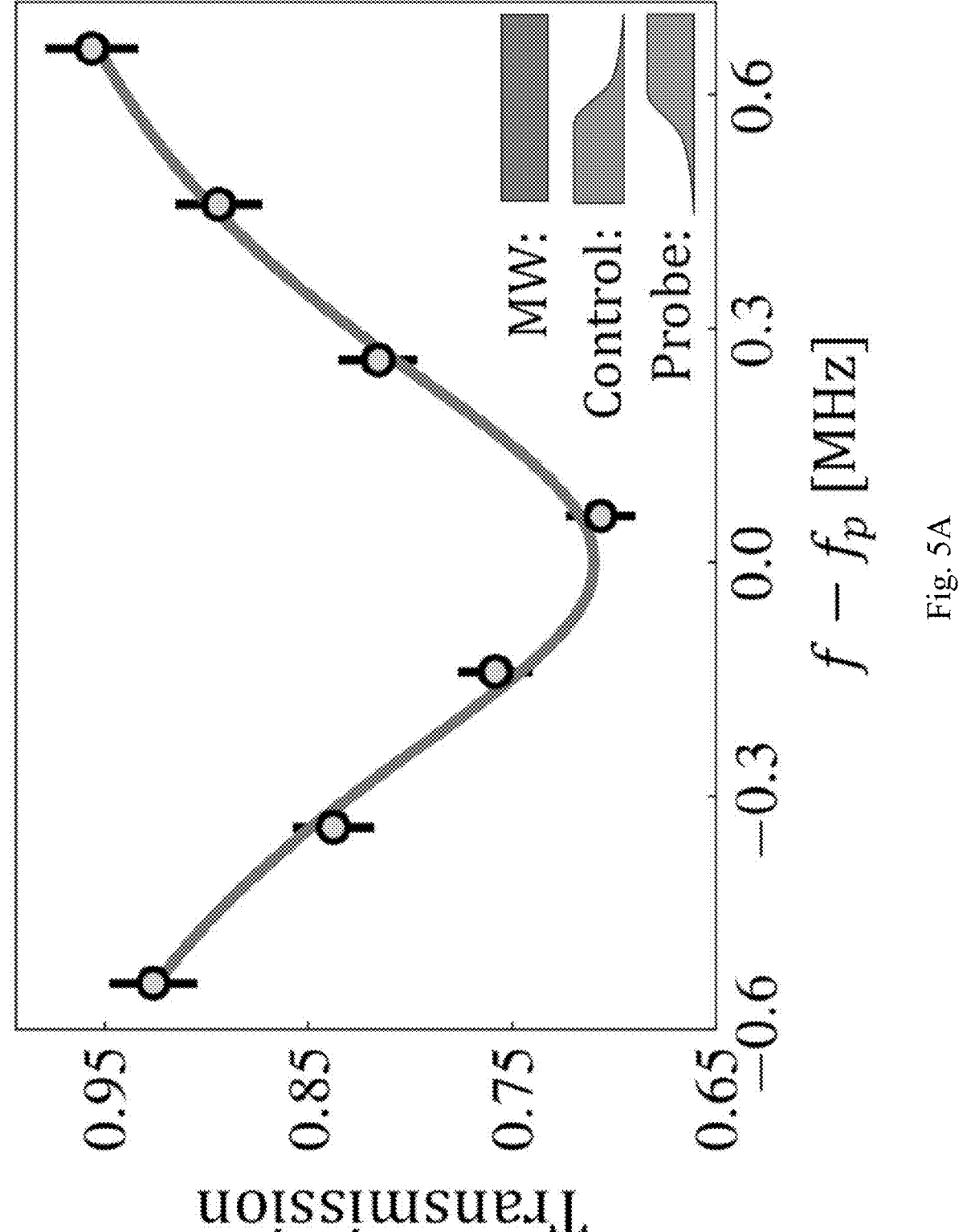
FIG. 5A is a graph of transmission over microwave frequency according to embodiments of the present disclosure.
Figure 5B:
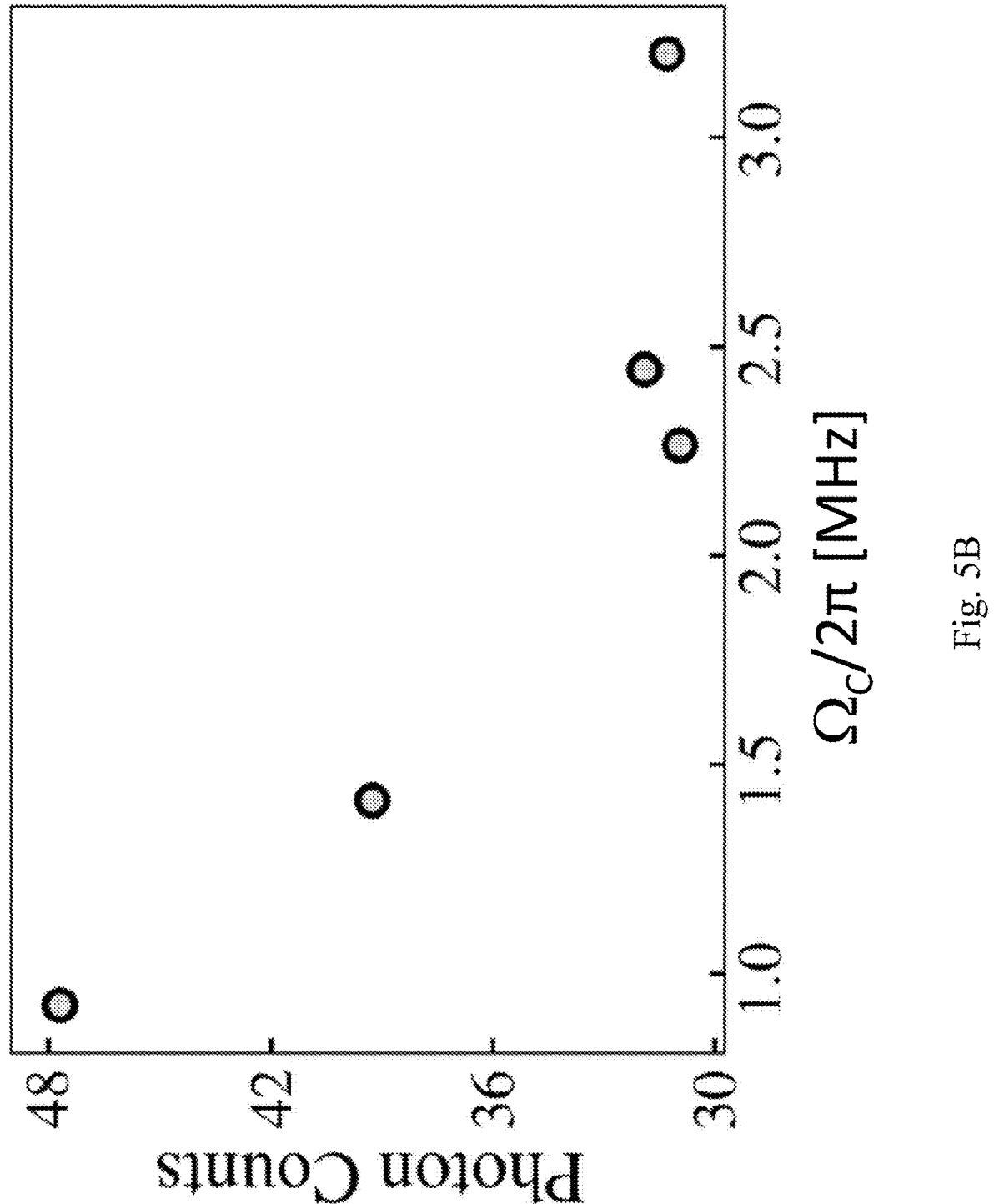
FIG. 5B is a plot of photon counts by frequency according to embodiments of the present disclosure.

Referring to FIGS. 5A-B, optimization of Rydberg preparation is illustrated. FIG. 5A shows the spectrum of the 3-photon resonance absorption to the $|\uparrow\rangle$ state vs. microwave frequency relative to $f_p=4916.1$ MHz. Atoms are prepared in the Rydberg state $|\uparrow\rangle$ by means of a three-photon STIRAP-like process. FIG. 5B shows photon counts integrated over a 10 µs window in the detection stage as a function of $\Omega_C$, the coupling of the $|e\rangle \rightarrow |\downarrow\rangle$ transition during the preparation stage. For small $\Omega_c$, the low coupling rate leads to a small population in the Rydberg state. As $\Omega_C$ increases, the average preparation to $|\uparrow\rangle$ increases as well. Once the whole ensemble is blockaded, photon counts reduce by 34%. To avoid multiple excitations, $\Omega_c=2\pi\times2.4$ MHz was chosen, which corresponds to the beginning of the saturated transmission level.

The preparation of the atom in the Rydberg state $|\uparrow\rangle \equiv |91P_{3/2}, m_J=3/2\rangle$ is performed with a three-photon STIRAP process as described above. The frequencies of probe and control laser beams are fixed, and the microwave frequency is scanned to optimize the state initialization stage. FIG. 5A displays the transmission of probe light during the detection stage as a function of the microwave frequency used for state preparation. $f_p=4916.1$ MHz was chosen, which maximizes the preparation probability.

The Rydberg blockade effect is essential for limiting the Rydberg excitation to one atom inside the ensemble. Since the blockade radius is proportional to $\Omega_c^{-1/3}$, the probability to have more than one excitation inside the ensemble will increase if the control Rabi frequency $\Omega_c$ is too high. $\Omega_c$ is optimized by monitoring the transmission of the probe light during the detection stage (FIG. 5B), and choosing the value $\Omega_c=2\pi\times2.4$ MHz that corresponds to the onset of saturation.

Loss of the Rydberg Atom and Creation of Rydberg Impurity During Detection

Figure 6:
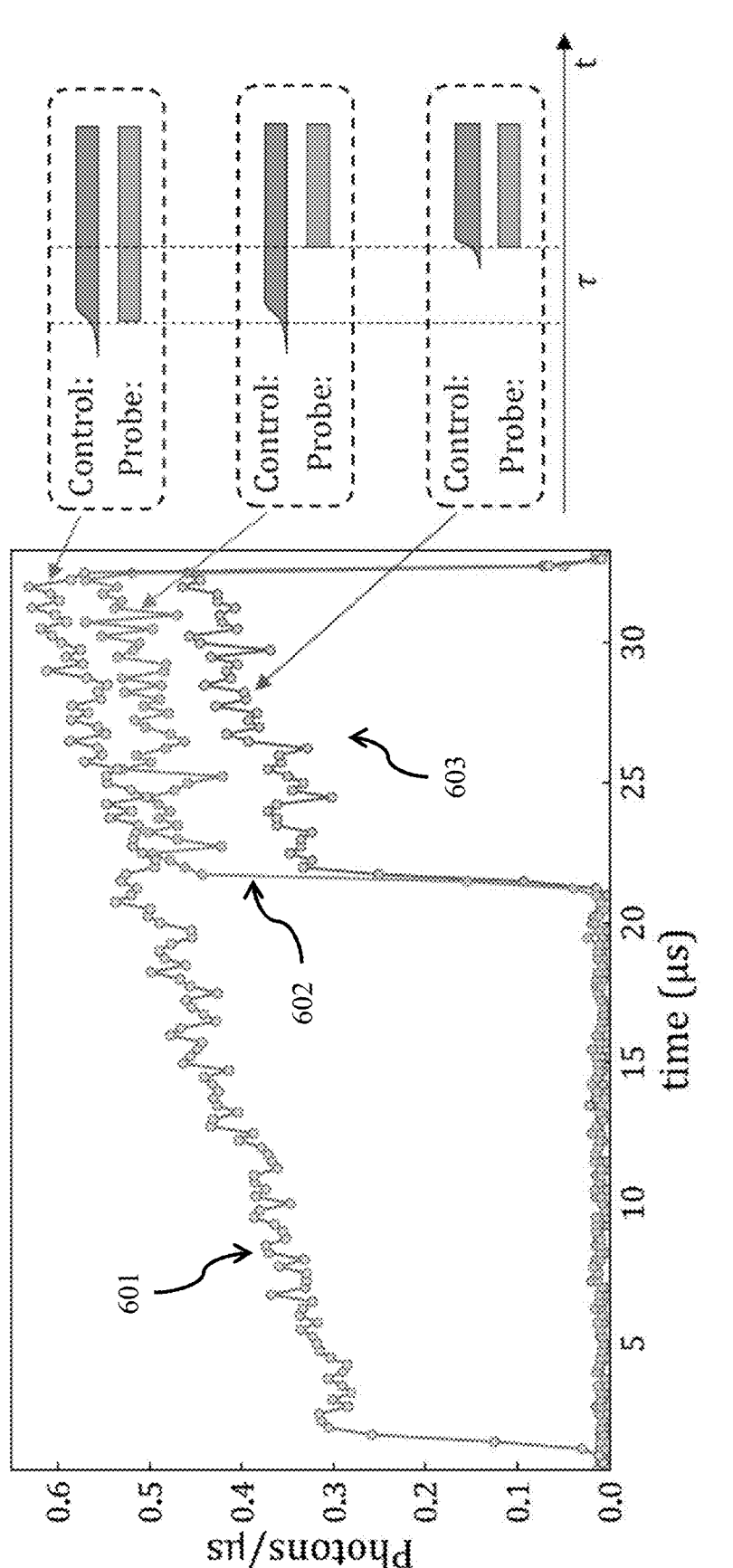
FIG. 6 is a graph of photon detection over time according to embodiments of the present disclosure.
Figure 7A:
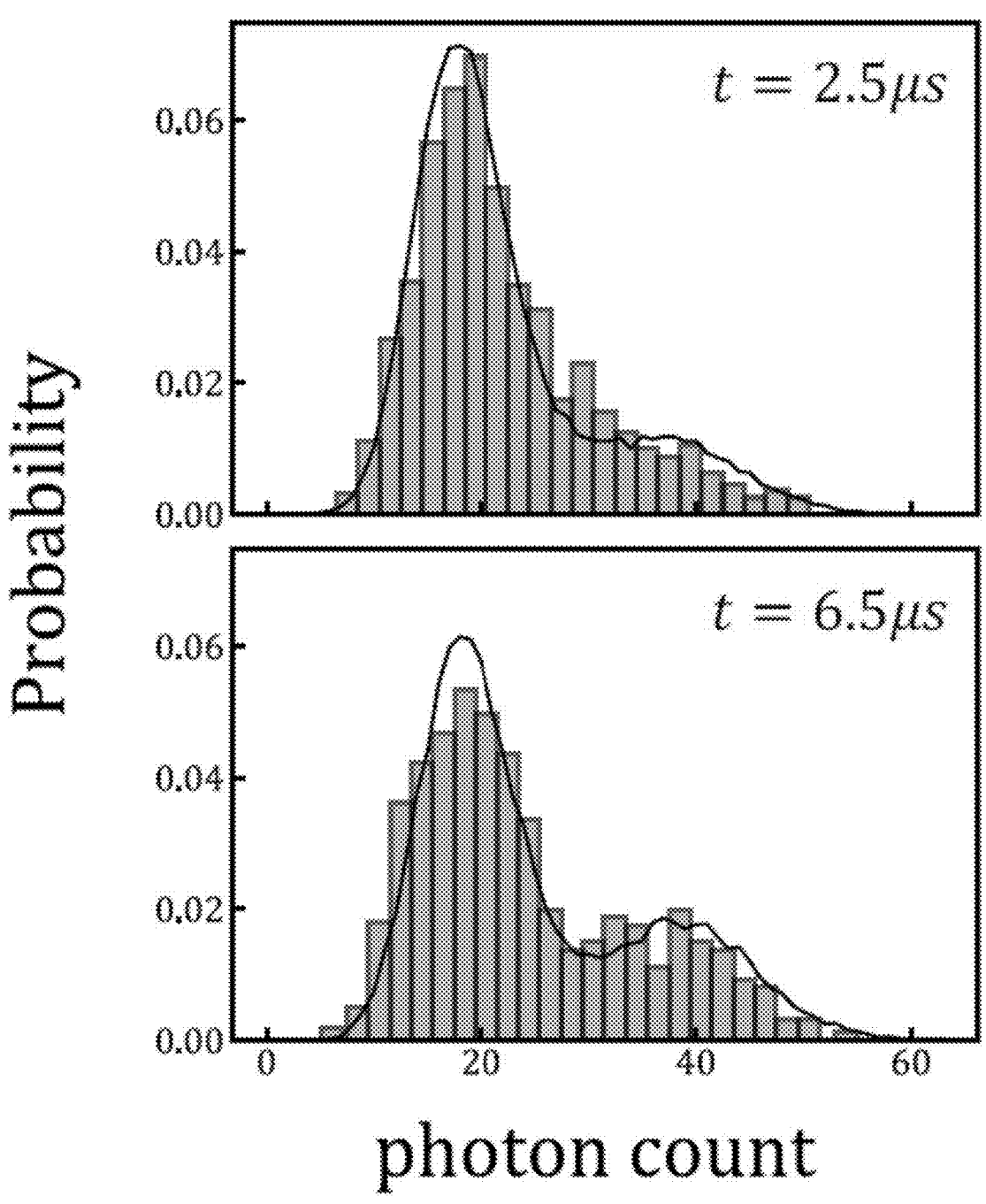
FIGS. 7A-7D are histograms of photon count according to embodiments of the present disclosure.
Figure 7B:
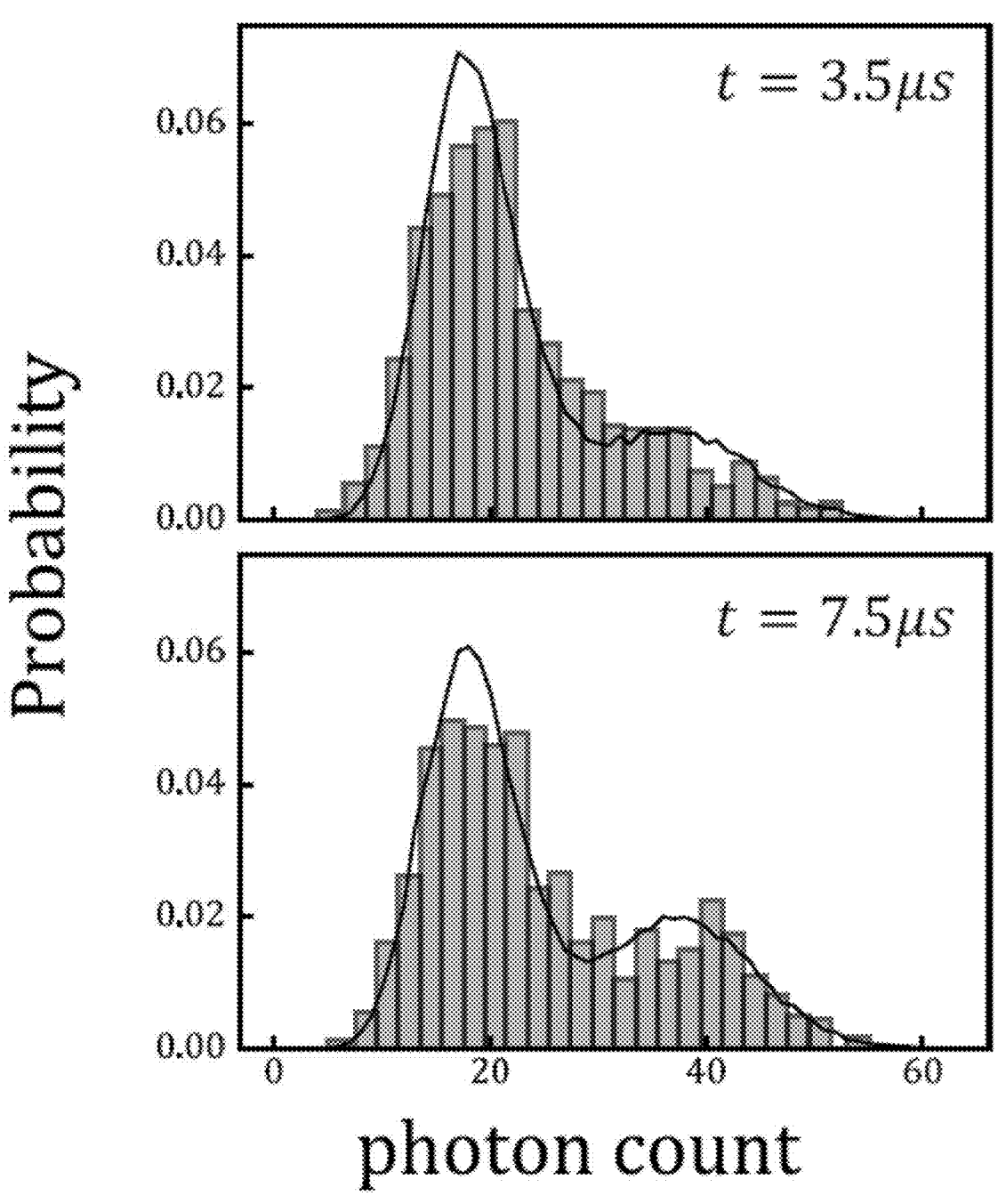
Figure 7C:
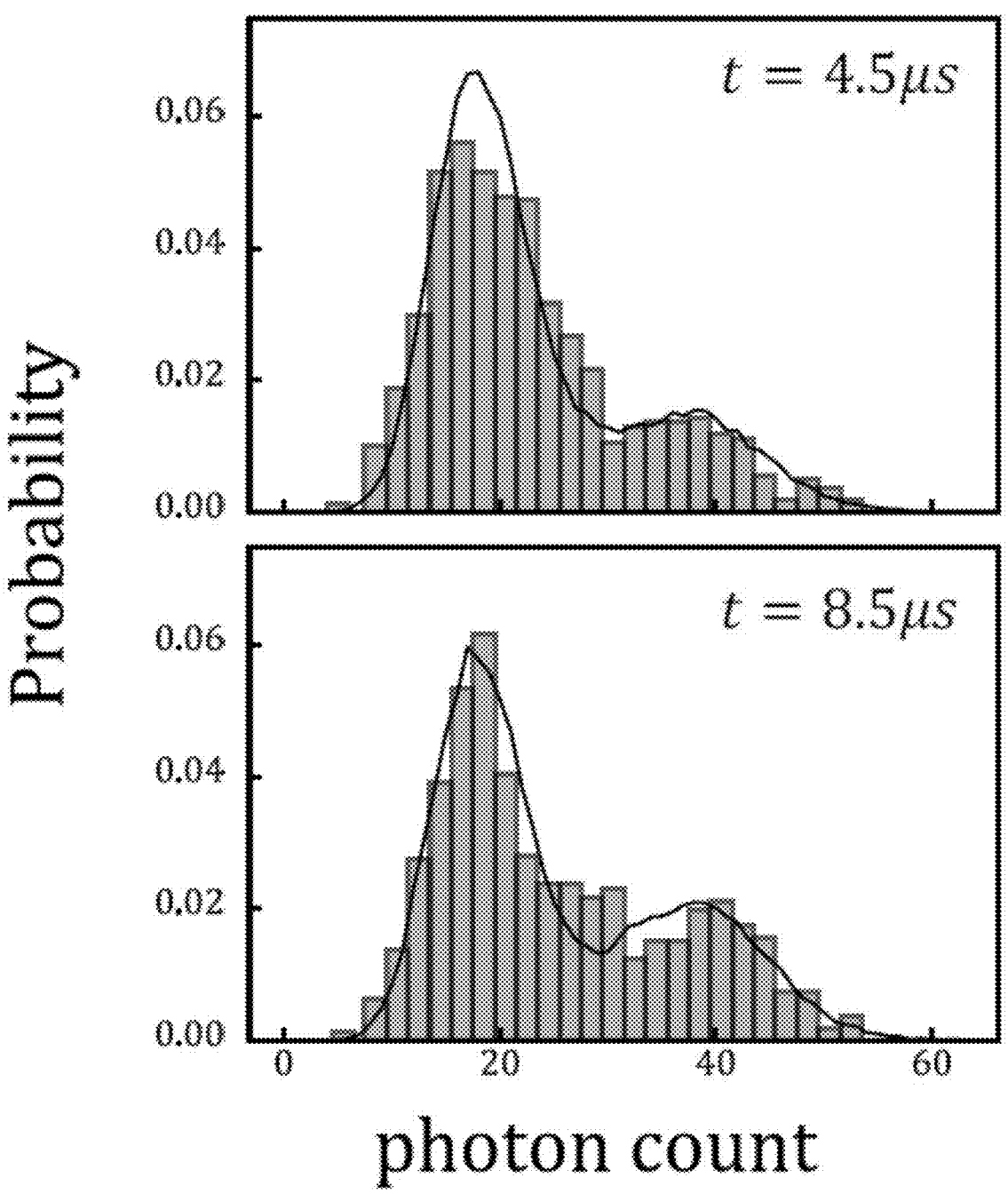
Figure 7D:
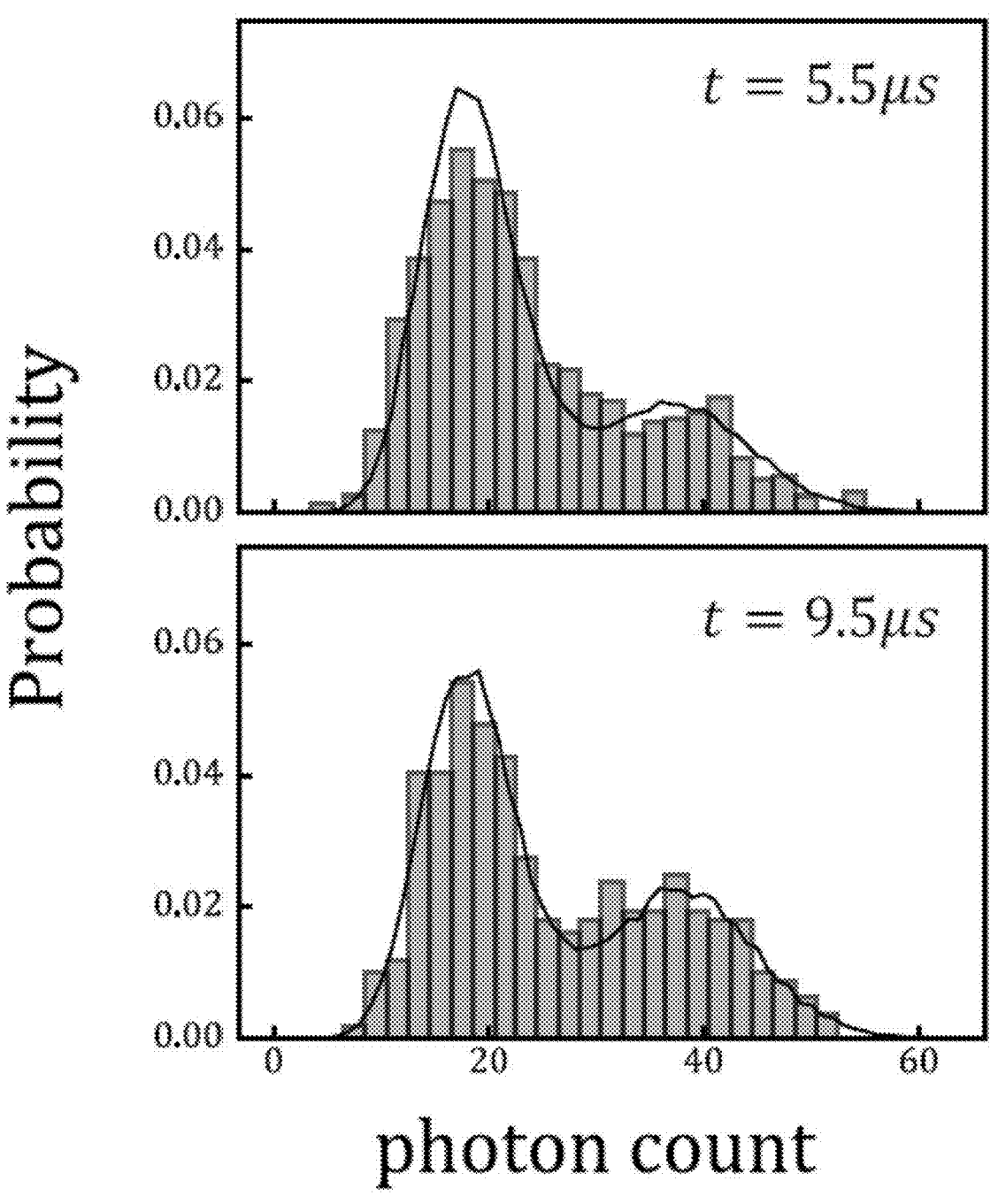

As shown in FIG. 2B, the rising slope of the transmitted photon count 203 during detection suggests a non-zero loss rate for the $|r'\rangle$ atom inside the ensemble. Referring to FIG. 6, to obtain insight into the loss mechanism, three different experimental sequences are compared: keeping both the probe and control light beams on for ~30 µs (curve 601); turning on the control light 20 µs earlier than the probe light (curve 602); and turning both control and probe light on at the same time, but 20 µs later than case 601 (curve 603). Points on curve 601 represent the data where both control and probe light are turned on for 35 µs, points on curve 602 represent the data when control light was on for the entire 35 µs and probe light is turned on only for the last 15 µs. Points on curve 603 represent the data when both control and probe light are turned on only for the last 15 µs. From the photon rate level of each sequence, one can conclude that control light has the most effect in increasing the loss of the $|r'\rangle$ state, and hence the transmission over time.

For sequences (601) and (602), the photon transmission levels at the time when the probe is turned on are approximately the same. This excludes the possibility that the loss of $|r'\rangle$ is due to the expansion of the gas or to other environment noise during the detection stage. On the other hand, there is a significant difference between the data for sequences (602) and (603). The larger loss for situation (603) indicates that the control light beam induces loss of $|r'\rangle$, possibly due to direct photoionization into the continuum. However, there is some remaining difference between the transmission for sequences (601) and (602), which suggests some additional loss during detection besides the photoionization effect. The extra loss mechanism may be related to the autoionization process that can occur when the Rydberg polariton with a Rydberg excitation component in $|r\rangle$ collides with the Rydberg atom in $|r'\rangle$.

The photoionization rate from the control beam is too small. The expected photoionization rate under these conditions is $\Gamma_{pi} \approx 340$ s$^{-1}$, two orders of magnitude smaller that the observed rate constant $\Gamma_{tr} \approx 3.5 \times 10^4$ s$^{-1}$ for the transmission curve. Furthermore, the repulsive ponderomotive potential of the control beam is too small by three orders of magnitude to explain the increase in transmission with time. On the other hand, a dc electric field of 20-40 mV/cm could provide enough admixture of the 92S Rydberg state to the 91P state so that the state can be coupled with the control laser to 5P$_{3/2}$, from where it decays to the ground state.

The loss of the Rydberg atom in $|r'\rangle$ during detection is modeled as a sudden change in the transmission. It is assumed that this occurs randomly with constant probability. This model is used to predict the expected histogram of probe photon counts at various detection times and compare it to the experimental data (FIGS. 7A-D).

FIGS. 7A-D are histograms showing measured distributions at varying start times of probing window with an integration time of 6 μs. These distributions are fit using the theoretical model to obtain the loss rate and preparation fidelity. The inferred preparation fidelity is $F_p=0.93\pm0.02$ The model has four free parameters: the photon rates in the presence and absence of an atom in $|r'\rangle$, respectively, the loss rate for the state $|r'\rangle$, and the fidelity of initially preparing the atom in $|r'\rangle$. The experimental data for various detection times are fit, as shown in FIGS. 7A-7D, and a loss rate of 0.035 μs$^{-1}$ and a preparation fidelity of $F_p=0.93\pm0.02$ are found. The model also captures the average rise in transmission 203 that is observed, as shown in FIG. 2B.

A similar model is used to fit the photon histogram for no atom initially prepared in the Rydberg state, where it is assumed that a Rydberg impurity is created at random times by decay of the Rydberg polariton during detection. This process manifests itself as a sudden increase in probe transmission. The histogram and the average transmission are fit to find a Rydberg impurity creation rate of 0.015 μs$^{-1}$.

Figure 8:
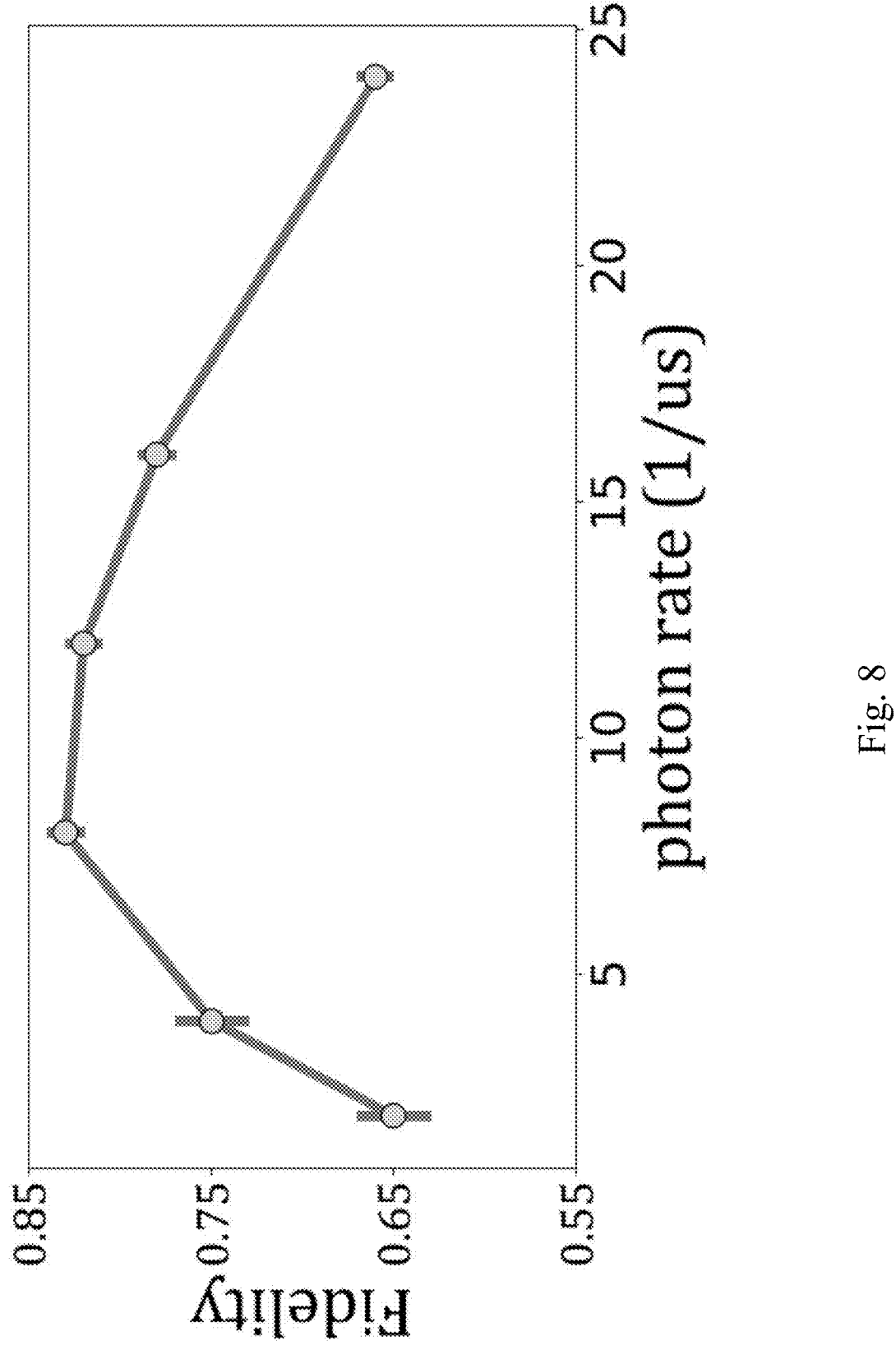
FIG. 8 is a graph of fidelity over photon rate according to embodiments of the present disclosure.

The creation of Rydberg impurity, combined with the self-blockade effect, limits the maximum probe photon rate. While a higher photon rate is preferred for faster detection, the fidelity eventually reduces as the probe photon rate increases. FIG. 8 plots the detection fidelity at various photon rates. A photon rate of 8/μs was chosen for the measurements shown above.

FIG. 8 plots the fidelity of detection as a function of the detected probe photon count rate in the absence of atomic ensemble with optimized readout time for each data point (between 3 μs and 8 μs). The data have been corrected for the preparation fidelity.

Repeated (Non-Destructive) Detection

Above, a readout fidelity of $F_d=0.92\pm0.04$ is provided in a 6 μs readout window, and for 30 counts as a detection threshold. Performing a second measurement in 6 μs with the same threshold shows a detection fidelity in this window of $0.81\pm0.04$ ($\approx F_d^2$). FIG. 2C shows the correlations between the two measurements; the results are summarized in the table below. This correlation between consecutive measurements is a signature of quantum non-demolition measurements (QND), and under ideal conditions the measurement would not be expected to induce any change in the state. The average conditional probability that the second measurement yields the same result as the first measurement is $0.79\pm0.03$.

Results for repeated (non-destructive) measurement are given in the table below. $|\uparrow\rangle$ preparation and detection refer to the preparation of an atom in the Rydberg state $|91P_{3/2}, m_j=1/2\rangle = |r'\rangle$. Both the first and second measurements last for 6 μs. The error (standard deviation) for each element in the table is 0.04.

| Measurement | Prepare $|\uparrow\rangle$ | | No $|\uparrow\rangle$ preparation | |
|---|---|---|---|---|
| | Detect $|\uparrow\rangle$ | No $|\uparrow\rangle$ detection | Detect $|\uparrow\rangle$ | No $|\uparrow\rangle$ detection |
| first | 0.92 | 0.08 | 0.10 | 0.90 |
| second | 0.76 | 0.24 | 0.19 | 0.81 |

Measurements of Rabi Oscillations

Magnetic sublevels $|r'\rangle = |91P_{3/2}, m_j=3/2\rangle$ and $|r\rangle = |92S_{1/2}, m_j=1/2\rangle$ are used to define the qubit. However, there is also the possibility of off-resonant coupling to other magnetic sublevels, especially at high Rabi frequency. A magnetic field of 10 G is applied to lift the Zeeman degeneracy, which results in a Zeeman splitting between neighboring magnetic sublevels of ~17 MHz for the $|91P_{3/2}\rangle$ manifold, and ~25 MHz for the $|92S_{1/2}\rangle$ manifold. To reduce the coupling to other transitions by the microwave driving fields, two radio frequency antennas are used whose relative amplitude and phase are tuned to suppress the π-polarized transition $|92S_{1/2}, m_j=1/2\rangle \leftrightarrow |91P_{3/2}, m_j=1/2\rangle$. A suppression by a factor of 10 is observed compared to a single antenna. A third microwave antenna can be added to also eliminate the σ$^-$ transition.

The normalized population of $|r'\rangle$ shown in the Rabi oscillation measurements (FIG. 3) are corrected by the preparation infidelity $(1-F_p)$ and the detection infidelity $(1-F_d)$. The measured probability $\tilde{p}(r')$ of detecting $|r'\rangle$ is related to the actual probability $p(r')$ by the following relation: $\tilde{p}(r')=F_p[(1-F_d)+(2F_d-1)p(r')]$, which is used to remove the preparation and readout error. Moreover, during the 8-hour measurements of the Rabi oscillations, there were drifts in alignments, which affected the averaged transmitted probe photon number. To account for such long-time drift, two extra reference measurements were added: one without the microwave driving field, and another one without the preparation stage. These two measurements allow monitoring of any slow drift of $F_p$ and $F_d$, and re-scaling the observed state probabilities.

Rydberg Blockade

Figure 9A:
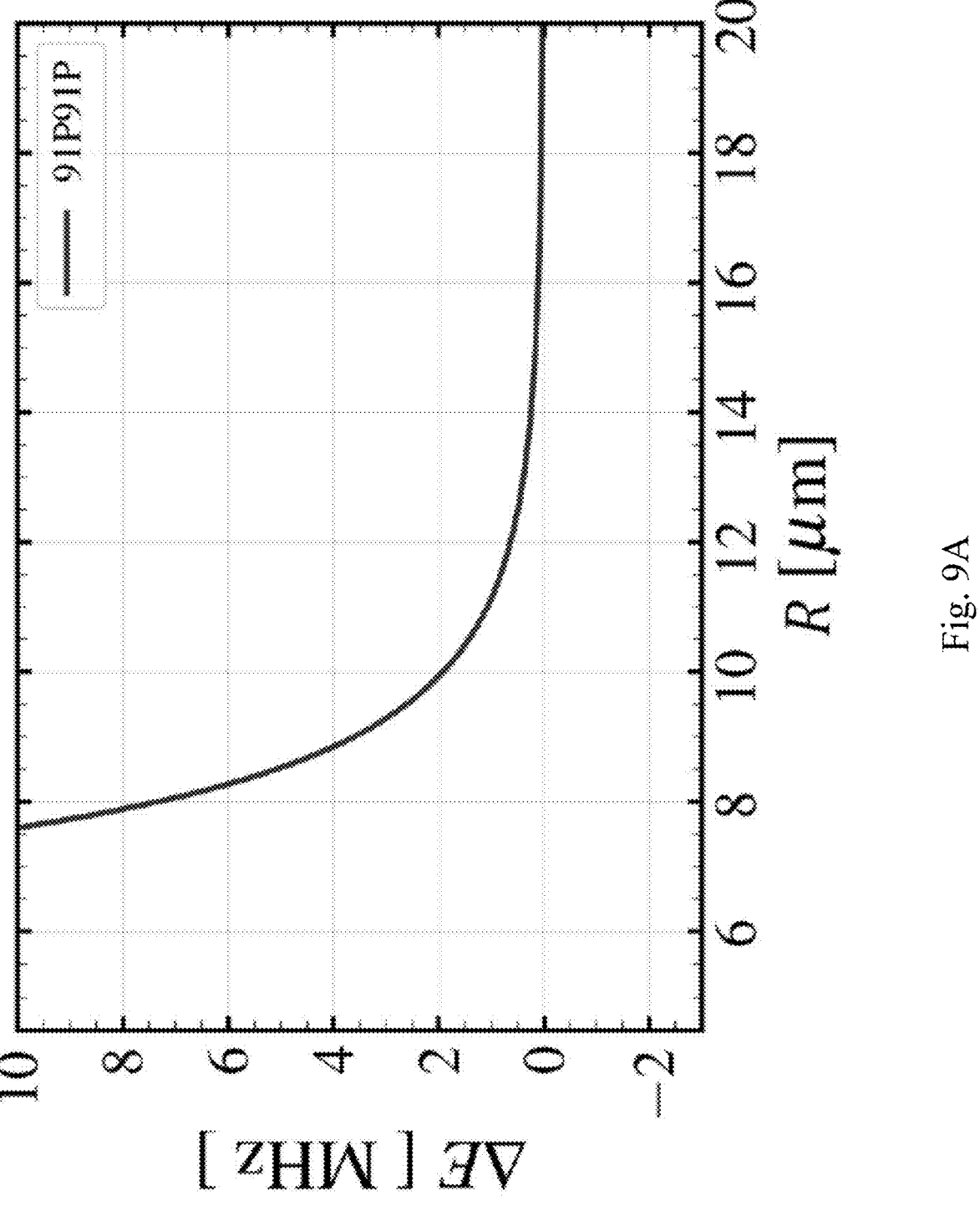
FIG. 9A is a graph of interaction energy over separation according to embodiments of the present disclosure.
Figure 9B:
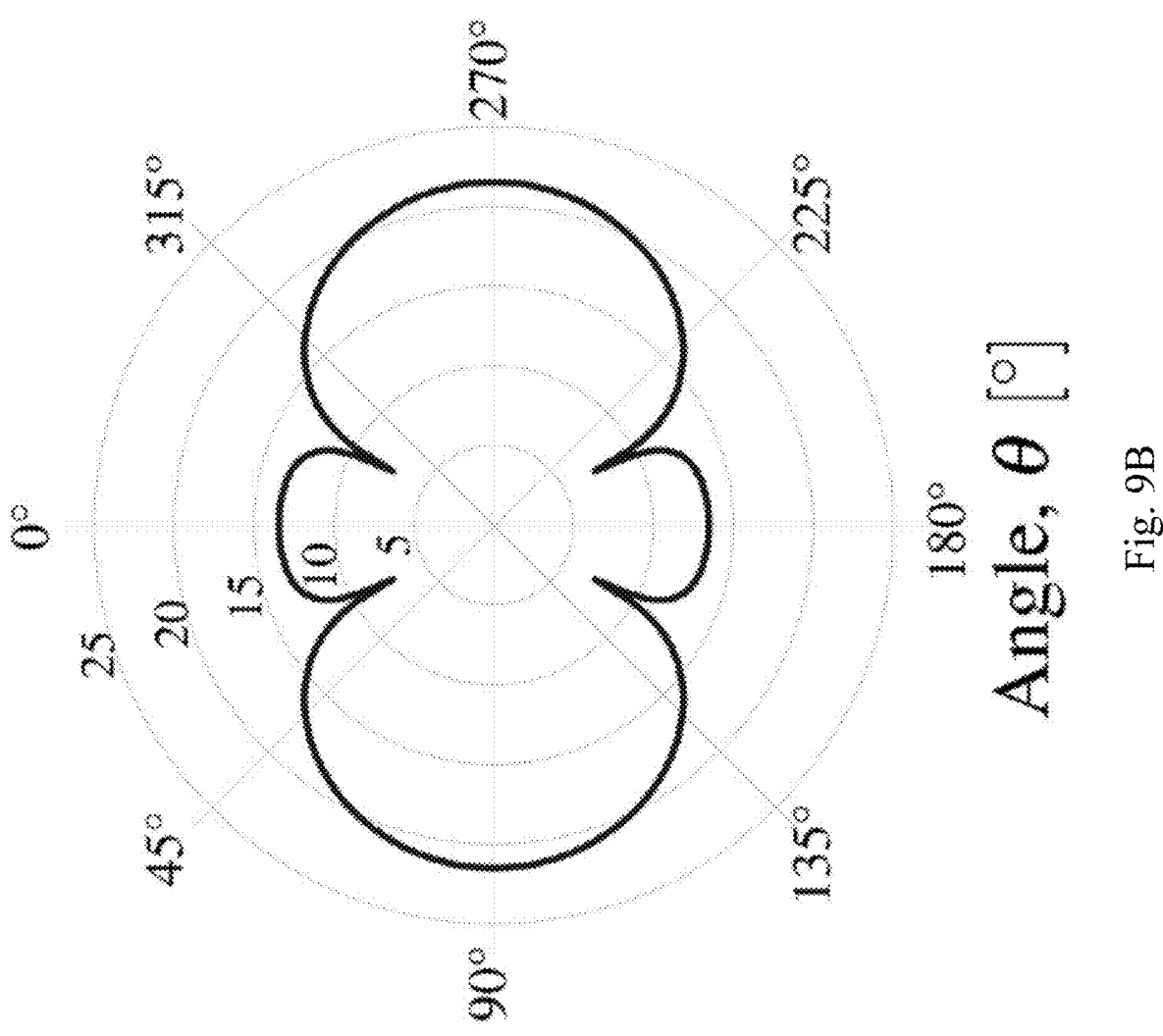
FIG. 9B is a plot of blockade volume according to embodiments of the present disclosure.

Referring to FIGS. 9A-B, Rydberg blockade during preparation is illustrated. In FIG. 9A, the interaction energy $\Delta E$ between two atoms in state $|r'\rangle$ is plotted as a function of separation R at $\theta=0$ calculated from exact diagonalization of the interaction Hamiltonian. The fitted van der Waals interaction coefficient is $C_6(\theta=0)=2\pi\times1.94$ THz·μm$^6$, which results in a blockade radius of $r_B(\theta=0)=12$ μm. FIG. 9B is a plot of $r_B(\theta)$ vs. $\theta$. Due to the anisotropy of the atomic wave-functions involved, the resulting interaction resembles an ellipsoid with aspect ratio of 1.6, with the semi-major axis at 90° from the quantization axis. This curve was obtained by perturbatively calculating $C_6(\theta)$.

Preparation Blockade: During the preparation stage, atoms are coupled to the $|91P_{3/2}, m_J=3/2\rangle$ state. A pair of atoms in this state will experience an anisotropic van der Waals interaction $V_{r'r}=C_6(\theta)/|R|^6$, where R is the distance between the pair of atoms and $\theta$ is the angle between the pair of atoms and the quantization axis (FIGS. 9A-B). From this interaction the effective blockade radius can be estimated as $V_{r'r}(r_B(\theta))=\hbar\Gamma_3/2$ where $\Gamma_3$ is the full width half maximum of the 3-photon resonance, $\Gamma_3=2\pi\times0.6$ MHz. A blockade radius of about 12 µm along the quantization direction ($\theta=0$) is estimated. The resulting blockade volume has an ellipsoid shape with an aspect ratio of 1.6, as shown on FIG. 9B. The average blockade radius of the ellipsoid is $r_B=15$ µm.

Detection Blockade: During the detection stage, the ground state atoms are coupled to the $|92S_{1/2}, m_J=1/2\rangle$ state. Since r and r' have different parity, they are dominated at large distances by dipole-dipole interactions ($\sim R^{-3}$), while at small distances they are dominated by van der Waals interactions ($\sim R^{-6}$). The dipole-dipole interaction induces the formation of symmetric and anti-symmetric molecular states ($|\pm\rangle=|rr'\rangle\pm|r'r\rangle)/\sqrt{2}$). The blockade radius during the detection stage is defined as $V_\pm(r_{B\pm})=\hbar\Gamma_{EIT}/2$, with $\Gamma_{EIT}$ being the EIT linewidth. The estimated blockade radius for each branch are $r_{B+}=12.7$ µm and $r_{B-}=6.2$ µm respectively. The estimated blockaded radius is therefore the average radius from both branches $r_B=9.4$ µm.

Figure 10:
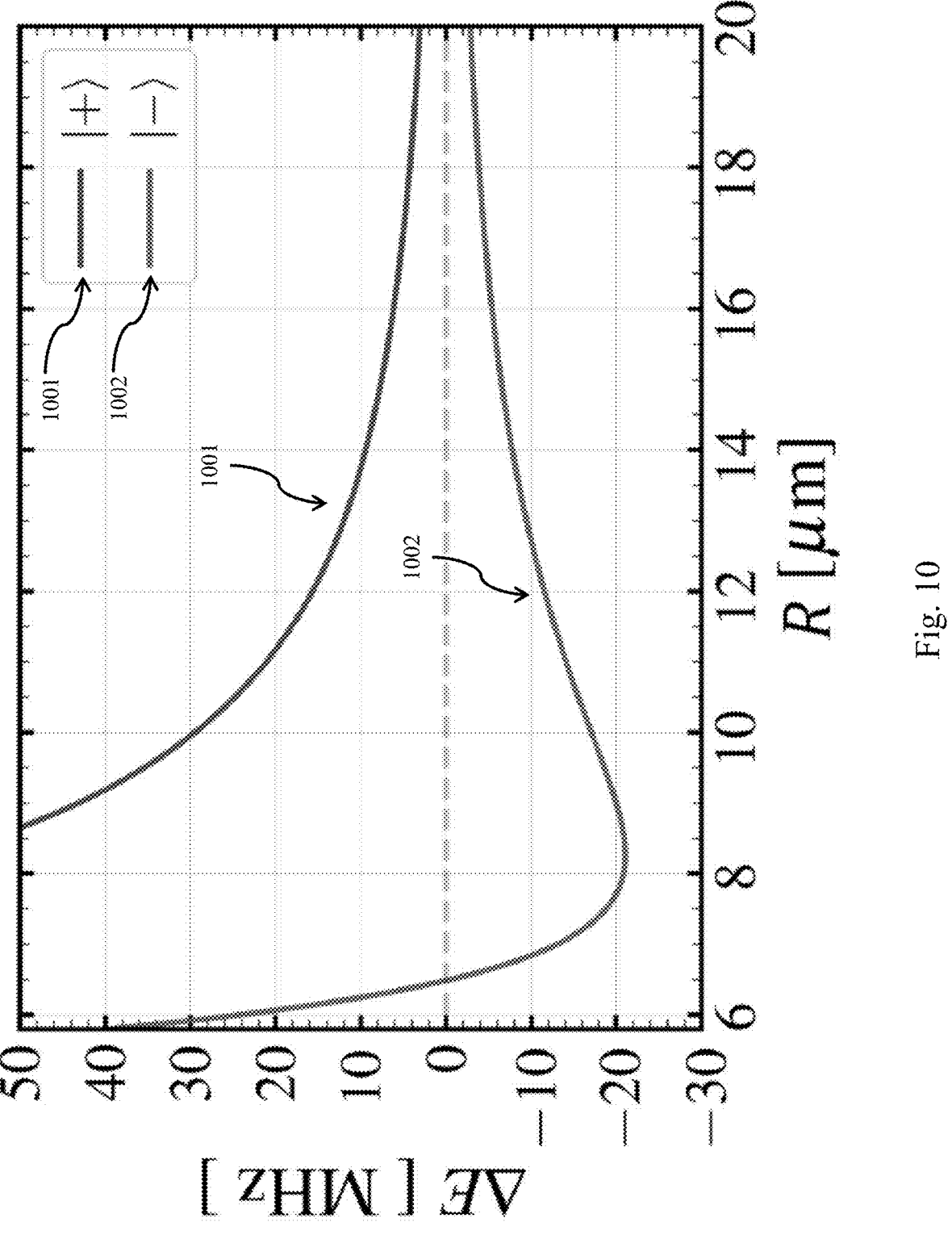
FIG. 10 is a graph of interaction energy over separation according to embodiments of the present disclosure.

FIG. 10 plots the $|rr'\rangle$ pair state interaction energy $\Delta E$ vs. separation R at $\theta=0$ calculated from exact diagonalization of the interaction Hamiltonian, illustrating the Rydberg blockade for $|rr'\rangle$ during preparation. The dipole-dipole interaction induces the formation of symmetric (1001) and anti-symmetric (1002) molecular states $|\pm\rangle=(|rr'\rangle\pm|r'r\rangle)/\sqrt{2}$. Lines correspond to the fitted model $A/R^6\pm B/R^3$, where the fit gives $A=C_6/h=6310$ GHz·µm$^6$ and $B=C_3/h=23.6$ GHz·µm$^6$.

Referring to FIGS. 11-14, various exemplary geometries are illustrated enabling readout of a plurality of qubits.

Figure 11:
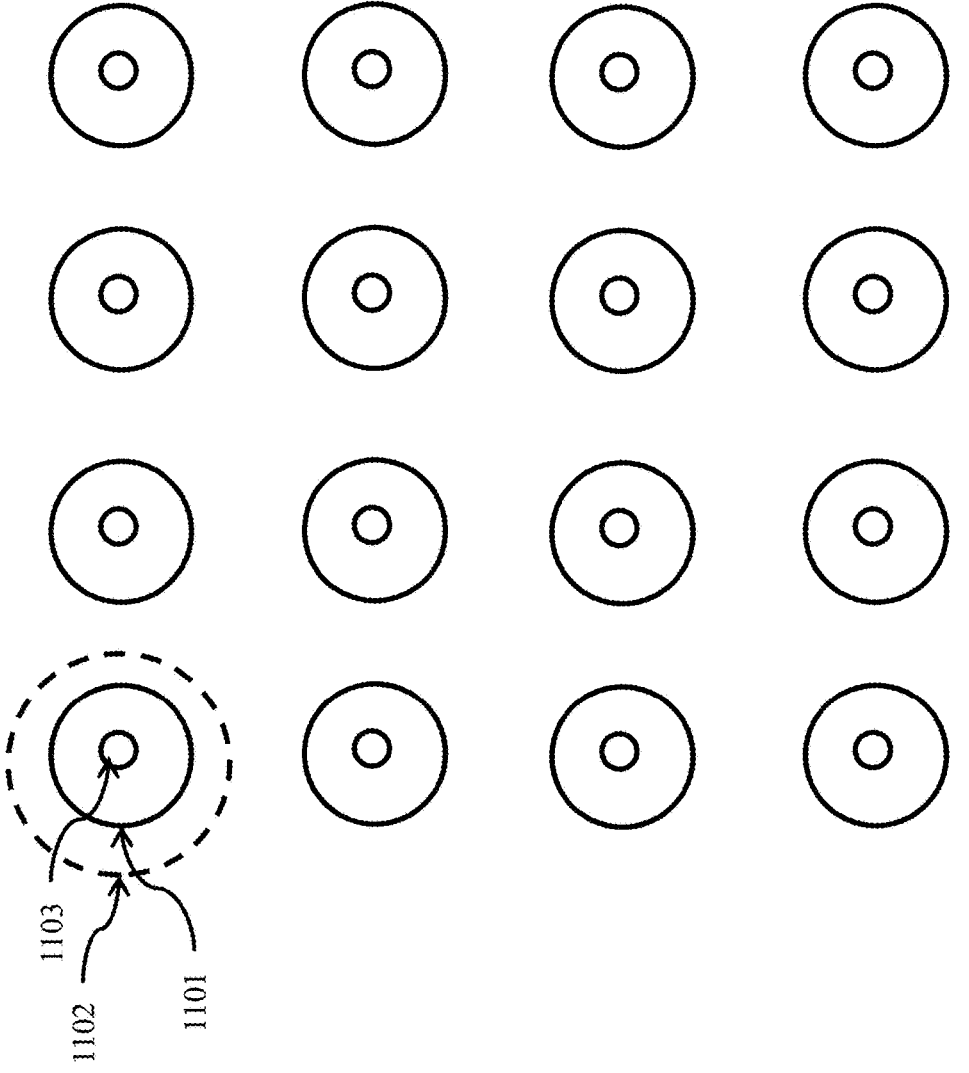
FIG. 11 is a schematic view of an exemplary configuration of a detector device according to embodiments of the present disclosure.

In FIG. 11, an array of optical traps, each indicated by a large circle in solid line, are arranged in a rectangular grid. Each optical trap 1101 includes an ensemble of atoms as described above. In addition, each optical trap 1101 includes an atomic qubit 1103, each indicated by a small circle in solid line. The blockade radius 1102 of the particles of each ensemble, indicated by a dashed circle, encompasses each optical trap and the qubit therein.

Figure 12:
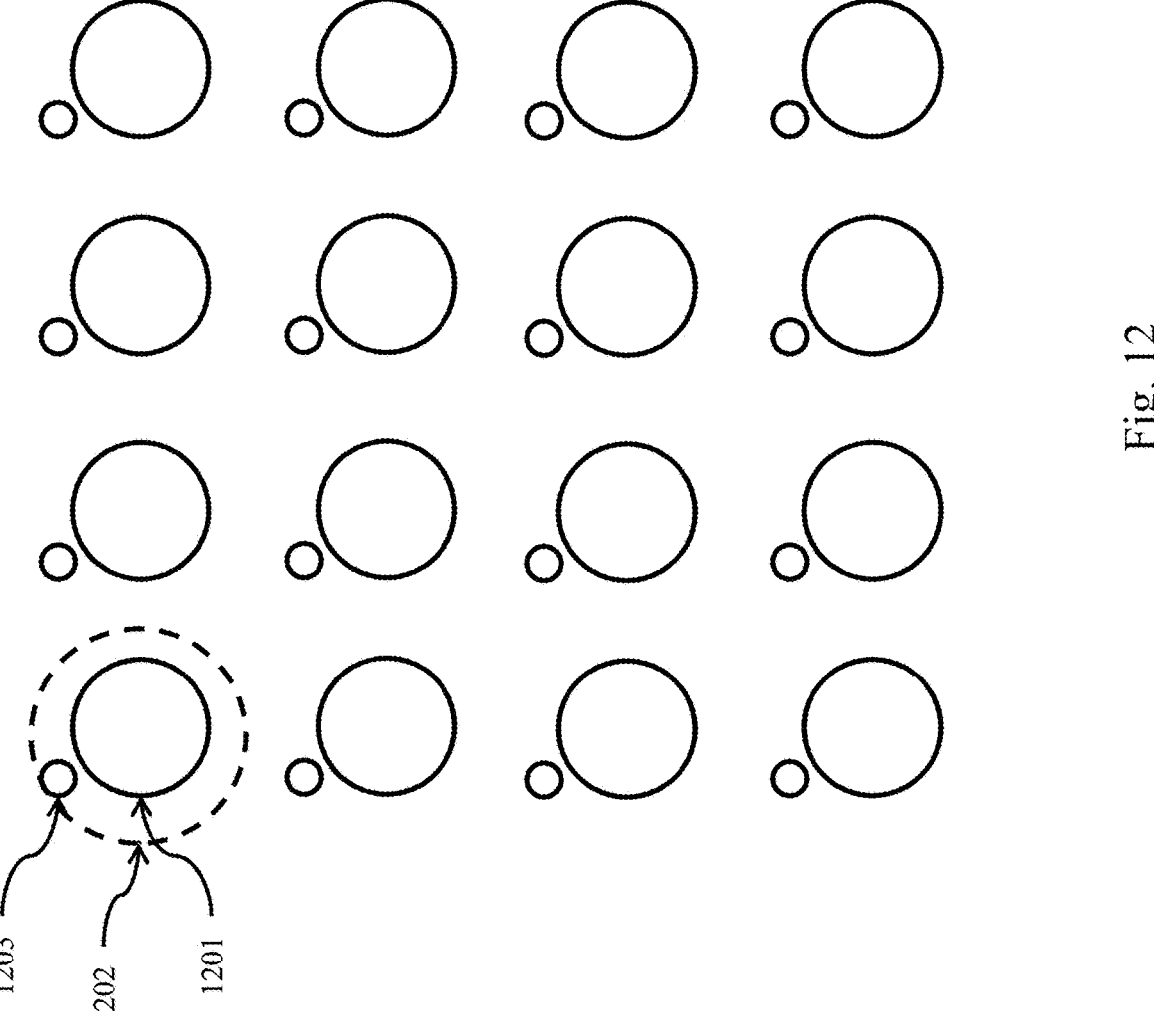
FIG. 12 is a schematic view of an exemplary configuration of a detector device according to embodiments of the present disclosure.

In FIG. 12, an array of optical traps, each indicated by a large circle in solid line, are arranged in a rectangular grid. Each optical trap 1201 includes an ensemble of atoms as described above. A second array of optical traps is provided, each optical trap of the second array includes an atomic qubit 1203, each indicated by a small circle in solid line. The blockade radius 1202 of the particles of each ensemble, indicated by a dashed circle, encompasses each optical trap and exactly one adjacent qubit. It will be appreciated that in this example, two arrays of optical traps are congruent with each other.

Figure 13:
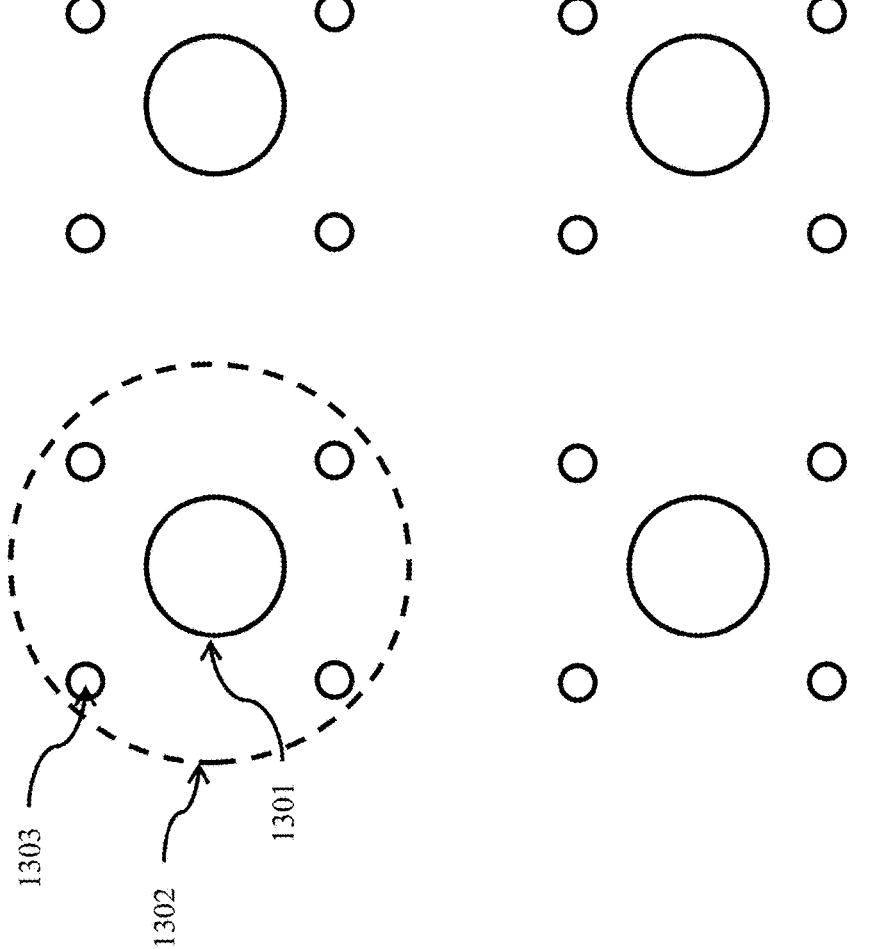
FIG. 13 is a schematic view of an exemplary configuration of a detector device according to embodiments of the present disclosure.

In FIG. 13, an array of optical traps, each indicated by a large circle in solid line, are arranged in a rectangular grid. Each optical trap 1301 includes an ensemble of atoms as described above. A second array of optical traps is provided, each optical trap of the second array includes an atomic qubit 1303, each indicated by a small circle in solid line. The blockade radius 1302 of the particles of each ensemble, indicated by a dashed circle, encompasses each optical trap and exactly four adjacent qubits. It will be appreciated that in this example, the two arrays of optical traps are of different sizes, the optical traps holding the qubits being spaced more closely than the optical traps holding the ensembles.

Figure 14:
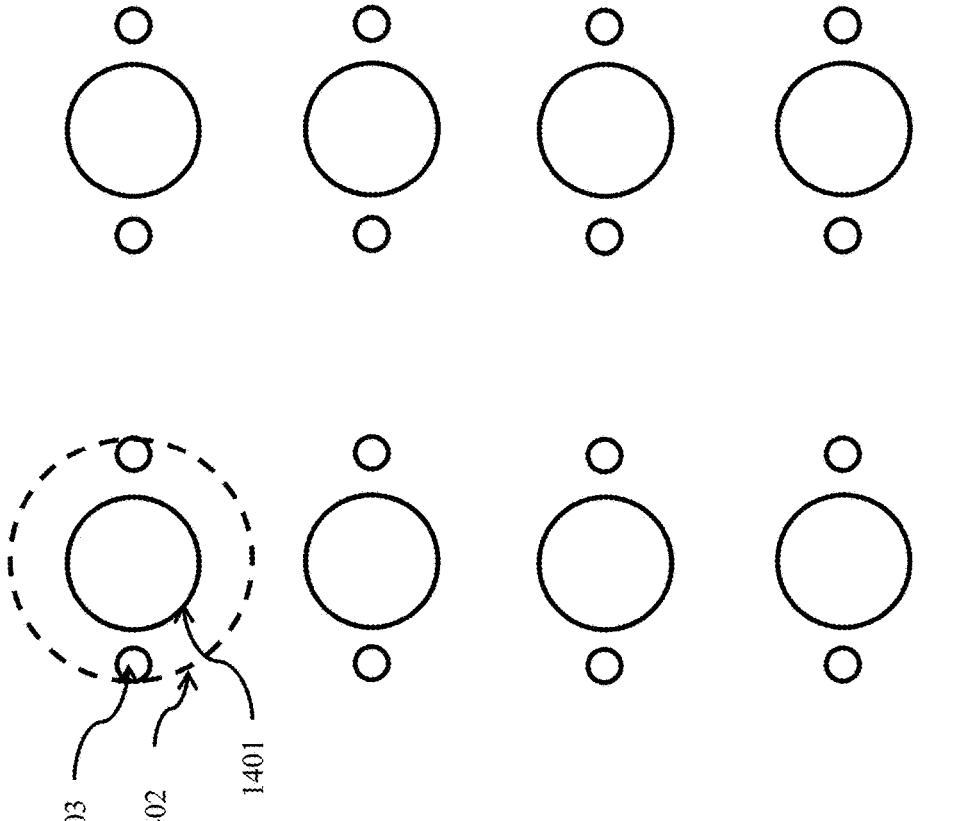
FIG. 14 is a schematic view of an exemplary configuration of a detector device according to embodiments of the present disclosure.

In FIG. 14, an array of optical traps, each indicated by a large circle in solid line, are arranged in a rectangular grid. Each optical trap 1401 includes an ensemble of atoms as described above. A second array of optical traps is provided, each optical trap of the second array includes an atomic qubit 1403, each indicated by a small circle in solid line. The blockade radius 1402 of the particles of each ensemble, indicated by a dashed circle, encompasses each optical trap and exactly two adjacent qubits. It will be appreciated that in this example, the two arrays of optical traps are of different sizes, the optical traps holding the qubits being spaced more closely than the optical traps holding the ensembles.

It will be appreciated that the rectangular configurations of FIGS. 11-14 are presented by way of example and not limitation. A variety of physical configurations may be employed to read out single qubits or groups of qubits.

Figure 15:
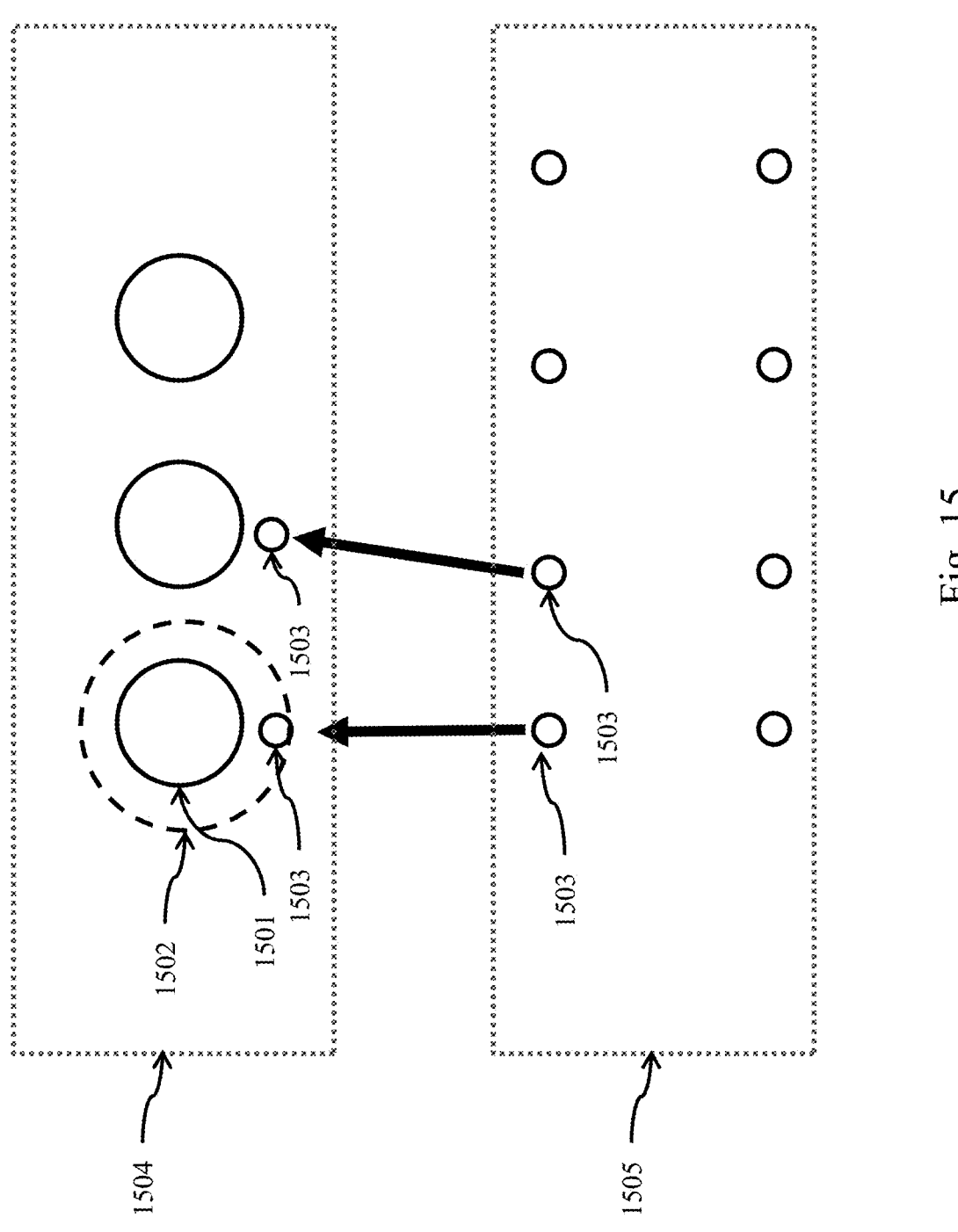
FIG. 15 is a schematic view of an exemplary configuration of a detector device according to embodiments of the present disclosure.

An aspect of the configurations shown in FIGS. 11-14 taking FIG. 13 as an example, is that every atom 1303 in the single atom array needs to be within the blockade radius 1302 of an ensemble 1301 for detection. Given recent experimental developments, it is possible to move atoms within the single atom array. This modified configuration, shown in FIG. 15, includes a detection region 1504 where an array of ensembles of atoms 1501 exists separate from the single atom array region 1505 (computation region). In the computational region 1505, atoms 1503 can be entangled into a collective state by means of a two-photon entanglement gate by pulse shaping the Rydberg and probing lasers' intensity, frequency and phase to optimize for state preparation. To detect the entangled state, individual atoms 1503 are moved by generating traps with an acousto-optic deflector which enables generation of multiple diffraction orders by using multiple tones to control the trap positions in real time. This capability enables moving atoms 1503 from the computational region 1505 to the detection region 1504 such that a moved atom 1503 is within the blockade radius 1502 of any of the ensembles 1501. After the move, light shines into the ensemble 1501 and the transmission of the ensemble 1501 is detected as described above. After detection, the individual atoms can be moved back to the computation region 1505.

Accordingly, in a first example embodiment, the present invention is a device for a fast detection of atoms (or particles) in a Rydberg state. In a 1$^{st}$ aspect of the 1$^{st}$ example embodiment, the device comprises at least one monochromatic light source configured to generate a first optical trap; an ensemble of particles disposed in the first optical trap, each particle of the ensemble of particles being excitable to a first Rydberg state and a second Rydberg state, the second Rydberg state having a blockade radius, each particle of the ensemble of particles being within the blockade radius of each other and within the blockade radius of an atomic qubit, the atomic qubit being a particle that is excitable to the second Rydberg state, the ensemble of particles having a first transmissivity at a first wavelength when neither any particle of the ensemble of particles nor the atomic qubit is in the second Rydberg state, the ensemble of particles having a second transmissivity at the first wavelength when the atomic qubit is in the second Rydberg state, the second transmissivity being lower than the first transmissivity; and a second monochromatic light source configured to drive each particle of the ensemble of particles into the first Rydberg state; a probe light source configured to direct a probe beam having the first wavelength to the ensemble of particles; and a photosensor configured to determine the state of the atomic qubit.

In a $2^{nd}$ aspect of the $1^{st}$ example embodiment, the device further comprises a third monochromatic light source configured to drive each particle of the ensemble of particles from a ground state to an intermediate state, and wherein the second monochromatic light source is configured to drive each particle of the ensemble of particles from the intermediate state to the first Rydberg state. The remainder of the features and example features are as described above with respect to the $1^{st}$ aspect of the $1^{st}$ example embodiment.

In a $3^{rd}$ aspect of the $1^{st}$ example embodiment, the photosensor is configured to measure a transmission of the probe beam by the ensemble of particles. The remainder of the features and example features are as described above with respect to the $1^{st}$ and $2^{nd}$ aspects of the $1^{st}$ example embodiment.

In a $4^{th}$ aspect of the $1^{st}$ example embodiment, the photosensor is configured to measure fluorescence of the ensemble of particles at the first wavelength. The remainder of the features and example features are as described above with respect to the $1^{st}$ through $3^{rd}$ aspects of the $1^{st}$ example embodiment.

In a $5^{th}$ aspect of the $1^{st}$ example embodiment, the device further comprises a microwave source configured to drive the atomic qubit between the first Rydberg state and the second Rydberg state. The remainder of the features and example features are as described above with respect to the $1^{st}$ through $4^{th}$ aspects of the $1^{st}$ example embodiment.

In a $6^{th}$ aspect of the $1^{st}$ example embodiment, the first optical trap is a crossed optical dipole trap. The remainder of the features and example features are as described above with respect to the $1^{st}$ through $5^{th}$ aspects of the $1^{st}$ example embodiment.

In a $7^{th}$ aspect of the $1^{st}$ example embodiment, each particle of the ensemble of particles is a $^{87}$Rb atom. The remainder of the features and example features are as described above with respect to the $1^{st}$ through $6^{th}$ aspects of the $1^{st}$ example embodiment.

In an $8^{th}$ aspect of the $1^{st}$ example embodiment, the first Rydberg state has a blockade radius, and wherein the mean distance between each pair of particles of the ensemble of particles is less than the blockade radius of the first Rydberg state. The remainder of the features and example features are as described above with respect to the $1^{st}$ through $7^{th}$ aspects of the $1^{st}$ example embodiment.

In an $9^{th}$ aspect of the $1^{st}$ example embodiment, the ensemble of particles has a total optical depth of about 1. The remainder of the features and example features are as described above with respect to the $1^{st}$ through $8^{th}$ aspects of the $1^{st}$ example embodiment.

In a $10^{th}$ aspect of the $1^{st}$ example embodiment, the atomic qubit is disposed in the first optical trap. The remainder of the features and example features are as described above with respect to the $1^{st}$ through $9^{th}$ aspects of the $1^{st}$ example embodiment.

In an $11^{th}$ aspect of the $1^{st}$ example embodiment, the device further comprises a plurality of first optical traps forming an array. The remainder of the features and example features are as described above with respect to the $1^{st}$ through $10^{th}$ aspects of the $1^{st}$ example embodiment.

In a $12^{th}$ aspect of the $1^{st}$ example embodiment, the array of first optical traps forms a rectangular grid. The remainder of the features and example features are as described above with respect to the $1^{st}$ through $11^{th}$ aspects of the $1^{st}$ example embodiment.

In a $13^{th}$ aspect of the $1^{st}$ example embodiment, the atomic qubit is disposed in a second optical trap different from the first optical trap. The remainder of the features and example features are as described above with respect to the $1^{st}$ through $12^{th}$ aspects of the $1^{st}$ example embodiment.

In a $14^{th}$ aspect of the $1^{st}$ example embodiment, the device further comprises a plurality of second optical traps forming an array. The remainder of the features and example features are as described above with respect to the $1^{st}$ through $13^{th}$ aspects of the $1^{st}$ example embodiment.

In a $15^{th}$ aspect of the $1^{st}$ example embodiment, the array of second optical traps forms a rectangular grid. The remainder of the features and example features are as described above with respect to the $1^{st}$ through $14^{th}$ aspects of the $1^{st}$ example embodiment.

In a $16^{th}$ aspect of the $1^{st}$ example embodiment, the second transmissivity is at most 0.5. The remainder of the features and example features are as described above with respect to the $1^{st}$ aspect through $15^{th}$ of the $1^{st}$ example embodiment.

In an $17^{th}$ aspect of the $1^{st}$ example embodiment, the first transmissivity is at least 0.9. The remainder of the features and example features are as described above with respect to the $1^{st}$ aspect through $16^{th}$ of the $1^{st}$ example embodiment.

In a $2^{nd}$ example embodiment, the present invention is a device. In a $1^{st}$ aspect of the $2^{nd}$ example embodiment, the device comprises: at least a first monochromatic light source configured to generate a first array of optical traps, each optical trap of the first array of optical traps having an ensemble of particles disposed therein; at least a second monochromatic light source configured to generate a second array of optical traps, wherein: each particle of each of the ensembles of particles being excitable to a first Rydberg state and a second Rydberg state, the second Rydberg state having a blockade radius, each particle of each of the ensembles of particles being within the blockade radius of the second Rydberg state of each particle in its ensemble, and of at least one optical trap of the second array of optical traps, at least one optical trap of the second array having an atomic qubit disposed therein, the atomic qubit being a particle that is excitable to the second Rydberg state, each ensemble of particles having a first transmissivity at a first wavelength when none of its particles is in the second Rydberg state, each ensemble of particles having a second transmissivity at the first wavelength when one particle in the at least one optical trap of the second array of optical traps is in the second Rydberg state, the second transmissivity being lower than the first transmissivity, each particle of each ensemble of particles being outside the blockade radius of the second Rydberg state of each particle of any other ensemble of particles; at least a third monochromatic light source configured to drive each particle of each ensemble of particles into the first Rydberg state; a probe light source configured to direct a probe beam having the first wavelength to the ensembles of particles; and a photosensor configured to determine a quantum mechanical state of at least one particles in the ensembles of particles.

In a $2^{nd}$ aspect of the $2^{nd}$ example embodiment, the photosensor is configured to measure a transmission of the probe beam by each of the ensembles of particles. The remainder of the features and example features are as described above with respect to the $1^{st}$ aspect of the $2^{nd}$ example embodiment.

In a $3^{rd}$ aspect of the $2^{nd}$ example embodiment, the photosensor is configured to measure fluorescence of each of the ensembles of particles at the first wavelength. The remainder of the features and example features are as described above with respect to the $1^{st}$ through $2^{nd}$ aspects of the $2^{nd}$ example embodiment.

In a $4^{th}$ aspect of the $2^{nd}$ example embodiment, the first array of optical traps forms a first rectangular grid; and the second array of optical traps forms a second rectangular grid. The remainder of the features and example features are as described above with respect to the $1^{st}$ through $3^{rd}$ aspects of the $2^{nd}$ example embodiment.

In a $5^{th}$ aspect of the $2^{nd}$ example embodiment, the first and second rectangular grids are congruent to each other, and exactly one optical trap of the second array of optical traps is within the blockade radius of the second Rydberg state of the particles of each ensemble of particles. The remainder of the features and example features are as described above with respect to the $1^{st}$ through $4^{th}$ aspects of the $2^{nd}$ example embodiment.

In a $6^{th}$ aspect of the $2^{nd}$ example embodiment, the first and second rectangular grids are configured so that exactly two optical traps of the second array of optical traps are within the blockade radius of the second Rydberg state of the particles of each ensemble of particles. The remainder of the features and example features are as described above with respect to the $1^{st}$ through $5^{th}$ aspects of the $2^{nd}$ example embodiment.

In a $7^{th}$ aspect of the $2^{nd}$ example embodiment, the first and second rectangular grids are configured so that exactly four optical traps of the second array of optical traps are within the blockade radius of the second Rydberg state of the particles of each ensemble of particles. The remainder of the features and example features are as described above with respect to the $1^{st}$ through $6^{th}$ aspects of the $2^{nd}$ example embodiment.

In a $3^{rd}$ example embodiment, the present invention is a method of determining a state of an atomic qubit. In a $1^{st}$ aspect of the $3^{rd}$ example embodiment, the method comprises: disposing an ensemble of particles proximate to an atomic qubit, wherein: each particle of the ensemble of particles being excitable to a first Rydberg state and a second Rydberg state, the second Rydberg state having a second blockade radius, the atomic qubit being a particle that is excitable to the second Rydberg state, each particle of the ensemble of particles being within the second Rydberg state blockade radius of each other and within the second Rydberg state blockade radius of the atomic qubit, the ensemble of particles having a first transmissivity at a first wavelength when neither any particle of the ensemble of particles nor the atomic qubit is in the second Rydberg state, the ensemble of particles having a second transmissivity at the first wavelength when the atomic qubit is in the second Rydberg state, the second transmissivity being lower than the first transmissivity; driving any one particle of the ensemble of particles into the first Rydberg state; directing a probe beam having the first wavelength to the ensemble of particles; and determining the state of the atomic qubit.

In a $2^{nd}$ aspect of the $3^{rd}$ example embodiment, determining the state of the atomic qubit comprises measuring a transmission of the probe beam by the ensemble of particles. The remainder of the features and example features are as described above with respect to the $1^{st}$ aspect of the $3^{rd}$ example embodiment.

In a $3^{rd}$ aspect of the $3^{rd}$ example embodiment, determining the state of the atomic qubit comprises measuring fluorescence of the ensemble of particles at the first wavelength. The remainder of the features and example features are as described above with respect to the $1^{st}$ through $2^{nd}$ aspects of the $3^{rd}$ example embodiment.

In a $4^{th}$ aspect of the $3^{rd}$ example embodiment, the method further comprises performing a computation using the atomic qubit prior to driving any one particle of the ensemble of particles into the first Rydberg state. The remainder of the features and example features are as described above with respect to the $1^{st}$ through $3^{rd}$ aspects of the $3^{rd}$ example embodiment.

In a $5^{th}$ aspect of the $3^{rd}$ example embodiment, the method further comprises moving the atomic qubit, thereby disposing the atomic qubit proximal to the ensemble of particles.

The present disclosure may be embodied as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of determining a state of an atomic qubit, the method comprising:

arranging an ensemble of particles, wherein particles of the ensemble of particles are excitable to a first Rydberg state having a blockade radius;

driving a particle of the ensemble of particles from a ground state into the Rydberg state;

moving an atomic qubit within the blockade radius of a particle of the ensemble of particles, wherein the atomic qubit is a particle that is excitable to the Rydberg state;

directing a probe beam having a first wavelength to the ensemble of particles, wherein:

the ensemble of particles has a first transmissivity at a first wavelength when neither any particle of the ensemble of particles nor the atomic qubit is in the Rydberg state, and the ensemble of particles has a second transmissivity at the first wavelength when the atomic qubit is in the Rydberg state, the second transmissivity being lower than the first transmissivity; and determining the state of the atomic qubit.

2. The method of claim 1, wherein determining the state of the atomic qubit comprises measuring a transmission of the probe beam by the ensemble of particles.

3. The method of claim 1, wherein determining the state of the atomic qubit comprises measuring fluorescence of the ensemble of particles at the first wavelength.

4. The method of claim 1, further comprising:

performing a computation using the atomic qubit prior to driving any one particle of the ensemble of particles into the Rydberg state.

5. The method of claim 1, wherein:

moving the atomic qubit comprises moving the atomic qubit using an acousto-optic deflector.

6. The method of claim 1, wherein the particle is driven to an intermediate Rydberg state and then to the Rydberg state using a three-photon driving process.

7. The method of claim 6, wherein the three-photon driving process comprises:

performing a first driving step wherein the particle is driven from the ground state into an excited state using a first laser, performing a second driving step wherein the particle is driven from the excited state into the intermediate Rydberg state using a second laser; and performing a third driving step wherein the particle from the intermediate Rydberg state is driven into the Rydberg state using a microwave field.

8. The method of claim 7, wherein the three-photon driving process further comprises:

detuning the first laser by $\Delta_e/(2\pi)=\delta_r/(2\pi)$ from its respective transition, and detuning the microwave field by $\Delta_e/(2\pi)=\delta_r/(2\pi)$ from its respective transition.

9. A quantum computer, comprising:

an acousto-optical deflector configured to, during operation of the quantum computer:

generate an ensemble of optical traps for trapping atomic qubits, the ensemble of traps being arranged to form:

a detection region; and a computational region; and move an atomic qubit from the computational region to the detection region;

a first laser and a second laser configured to perform two-photon entanglement gates between atomic qubits, wherein the second laser is further configured to illuminate the ensemble of optical traps; and a photosensor configured to determine a state of the atomic qubit.

10. The quantum computer of claim 9, wherein the acousto-optical deflector is configured to arrange an array of trapped ensembles of atoms in the detection region, wherein:

atoms of the ensemble of atoms are excitable to a first Rydberg state and a second Rydberg state, the second Rydberg state having a second blockade radius, and atoms of the ensemble of atoms are disposed within the second blockade radius of another atom of the ensemble of atoms.

11. The quantum computer of claim 10, wherein the acousto-optical deflector is configured to arrange an array of trapped atomic qubits in the computational region, wherein the atomic qubits are atoms that are excitable to the second Rydberg state.

12. The quantum computer of claim 9, wherein the acousto-optical deflector is configured to generate multiple diffraction orders using multiple trap positions.

13. The quantum computer of claim 12, wherein the acousto-optical deflector is configured to control the multiple trap positions in real time.

14. The quantum computer of claim 9, wherein the quantum computer further comprises at least one filter configured to pulse shape an intensity, a frequency, and/or a phase of the first laser and/or the second laser.

15. The quantum computer of claim 14, wherein the first laser comprises a Rydberg laser.

16. The quantum computer of claim 14, wherein the second laser comprises a probing laser.

17. The quantum computer of claim 14, wherein the photosensor is configured to determine the state of the atomic qubit by measuring a transmitted light of the second laser through the ensemble of optical traps.

18. The quantum computer of claim 9, wherein the quantum computer further comprises a third laser and a fourth laser configured to form a crossed optical dipole trap.

19. The quantum computer of claim 18, wherein the third laser and the fourth laser are configured to generate orthogonal far-detuned laser beams.

20. A method of reading out states of atomic qubits, the method comprising:

generating an ensemble of optical traps, the ensemble of optical traps comprising:

a detection region; and a computation region;

trapping an ensemble of atoms in the detection region, wherein:

atoms of the ensemble of atoms are excitable to a Rydberg state having a blockade radius, and atoms of the ensemble of atoms are disposed within the blockade radius of another atom of the ensemble of atoms, trapping atomic qubits in the computation region, an atomic qubit being an atom that is excitable to the Rydberg state;

entangling the atomic qubits into a collective state in the computation region;

moving an atomic qubit from the computation region to the detection region;

determining the collective state of the atomic qubits; and moving the atomic qubit from the detection region to the computation region.

21. The method of claim 20, wherein generating an ensemble of optical traps comprises loading atomic qubits and the ensemble of atoms into crossed optical dipole traps.

22. The method of claim 20, wherein entangling the atomic qubits in a collective state comprises using a first laser and a second laser to perform two-photon entanglement gates.

23. The method of claim 22, wherein performing two-photon entanglement gates on the atomic qubits comprises pulse shaping an intensity, a frequency, and/or a phase of the first laser and/or the second laser.

24. The method of claim 22, wherein determining the collective state of the atomic qubits comprises:

illuminating the ensemble of atoms with light using the second laser; and measuring light transmitted through the ensemble of atoms using a photodetector.

25. The method of claim 24, wherein determining the collective state of the atomic qubits of the second laser occurs under conditions of conditions of electromagnetically induced transparency (EIT).

26. The method of claim 20, wherein moving atomic qubits comprises:

generating moving traps with an acousto-optic deflector;

loading atomic qubits into the moving traps; and moving the moving traps using the acousto-optic deflector.

27. The method of claim 26, wherein moving the atomic qubits further comprises moving the atomic qubits within the blockade radius of an atom of the ensemble of atoms.

28. The method of claim 20, wherein determining the collective state of the atomic qubits comprises measuring a fluorescence of the ensemble of atoms.

* * * * *